(12) United States Patent
Weis et al.

(10) Patent No.: US 11,404,535 B2
(45) Date of Patent: Aug. 2, 2022

(54) SEMICONDUCTOR DEVICE AND METHOD FOR PRODUCING A SEMICONDUCTOR DEVICE

(71) Applicant: Infineon Technologies Austria AG, Villach (AT)

(72) Inventors: Rolf Weis, Dresden (DE); Richard Hensch, Dresden (DE); Ahmed Mahmoud, Munich (DE)

(73) Assignee: Infineon Technologies Austria AG, Villach (AT)

( * ) Notice: Subject to any disclaimer, the term of this patent is extended or adjusted under 35 U.S.C. 154(b) by 20 days.

(21) Appl. No.: 16/704,328

(22) Filed: Dec. 5, 2019

(65) Prior Publication Data
US 2020/0185494 A1    Jun. 11, 2020

(30) Foreign Application Priority Data

Dec. 6, 2018    (EP) .................................... 18210658

(51) Int. Cl.
*H01L 29/06* (2006.01)
*H01L 21/225* (2006.01)
(Continued)

(52) U.S. Cl.
CPC ...... *H01L 29/0634* (2013.01); *H01L 21/2253* (2013.01); *H01L 21/26513* (2013.01); *H01L 21/324* (2013.01); *H01L 29/1095* (2013.01); *H01L 29/66712* (2013.01); *H01L 29/7805* (2013.01)

(58) Field of Classification Search
CPC ............. H01L 29/0634; H01L 29/1066; H01L 29/808; H01L 27/098; H01L 29/1095; H01L 29/66712; H01L 29/7805; H01L 29/78; H01L 29/7835; H01L 27/092; H01L 27/1222; H01L 27/127; H01L 21/2253;
(Continued)

(56) References Cited

U.S. PATENT DOCUMENTS 9,450,050 B2 *   9/2016   Bobde .................... H01L 29/808
2011/0127586 A1 *   6/2011   Bobde ............... H01L 29/66696
257/262

(Continued)

FOREIGN PATENT DOCUMENTS

EP    3644374 A1    4/2020

*Primary Examiner* — Bilkis Jahan
*Assistant Examiner* — Victor V Barzykin
(74) *Attorney, Agent, or Firm* — Murphy, Bilak & Homiller, PLLC

(57) ABSTRACT

A method includes forming a layer stack with a plurality of first layers of a first doping type and a plurality of second layers of a second doping type complementary to the first doping type on top of a carrier. Forming the layer stack includes forming a plurality of epitaxial layers on the carrier. Forming each of the plurality of epitaxial layers includes depositing a layer of semiconductor material, forming at least two first implantation regions of one of a first type or a second type at different vertical positions of the respective layer of semiconductor material, and forming at least one second implantation region of a type that is complementary to the type of the first implantation regions, the first implantation regions and the second implantation regions being arranged alternatingly.

17 Claims, 10 Drawing Sheets

(51) Int. Cl.
*H01L 21/265* (2006.01)
*H01L 21/324* (2006.01)
*H01L 29/10* (2006.01)
*H01L 29/66* (2006.01)
*H01L 29/78* (2006.01)

(58) Field of Classification Search
CPC ............. H01L 21/26513; H01L 21/324; H01L 21/8238; H01L 21/8232; H01L 29/78654
See application file for complete search history.

(56) References Cited

U.S. PATENT DOCUMENTS

| | | | |
|---|---|---|---|
| 2014/0227837 A1* | 8/2014 | Bobde | H01L 29/66484 438/192 |
| 2017/0092716 A1* | 3/2017 | Mauder | H01L 29/0696 |
| 2017/0222043 A1* | 8/2017 | Hirler | H01L 23/49575 |
| 2018/0061979 A1* | 3/2018 | Weber | H01L 21/78 |

* cited by examiner

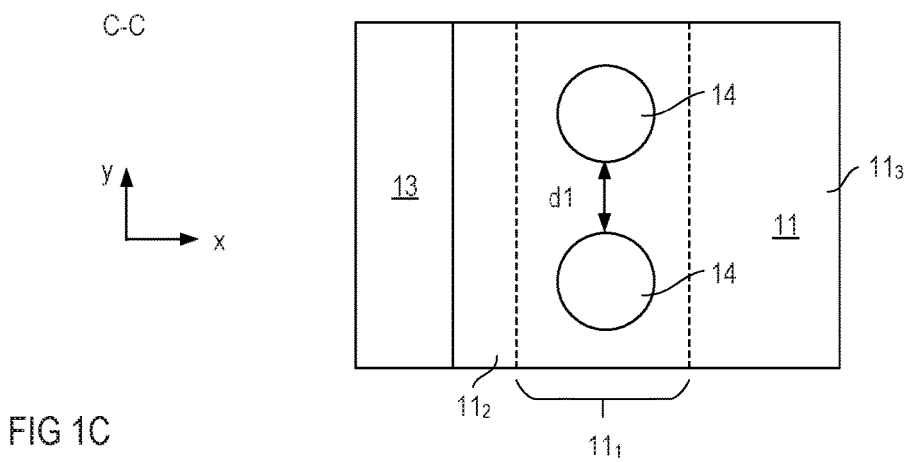
FIG 1C
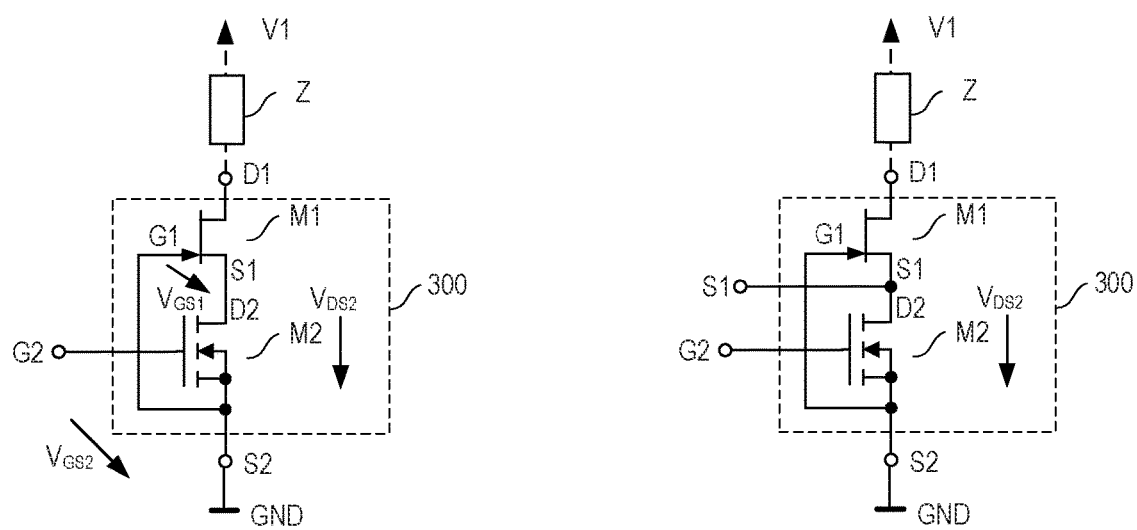
FIG 2A
FIG 2B
FIG 2C
FIG 2D

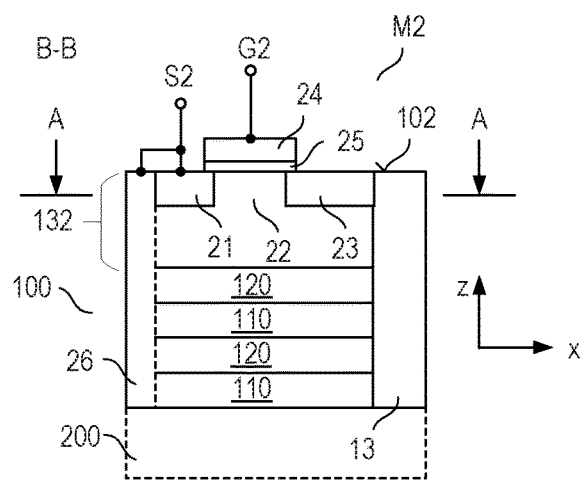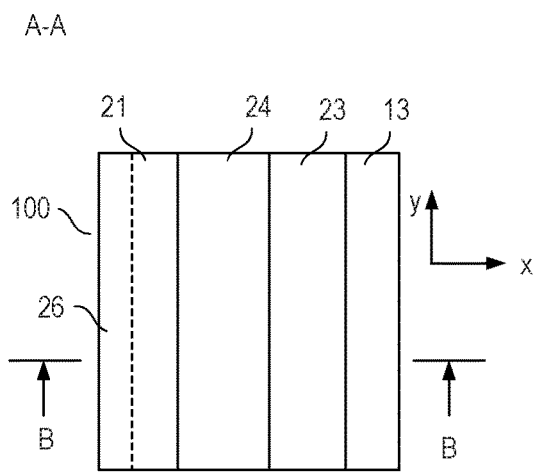
FIG 3A  FIG 3B
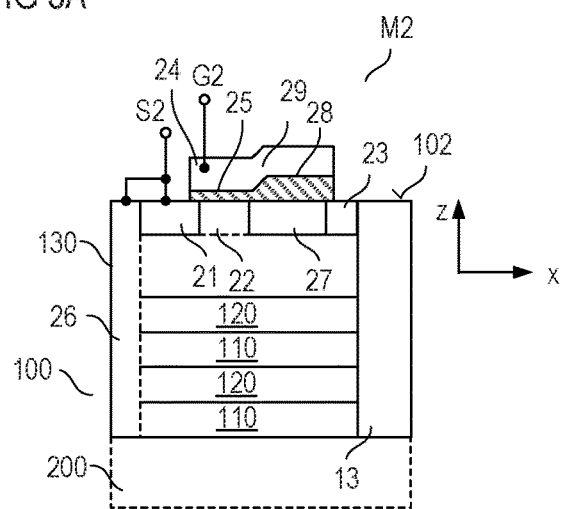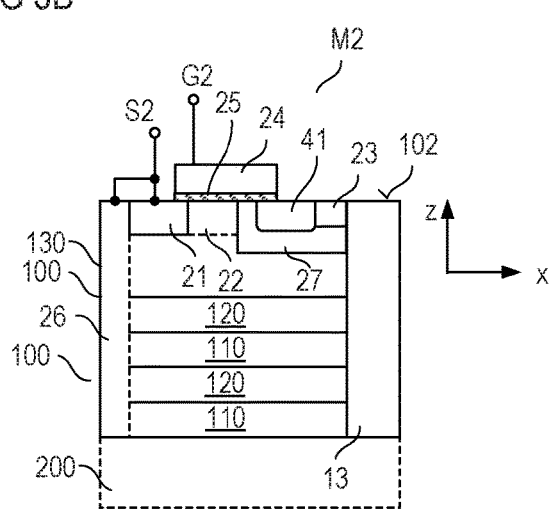
FIG 4  FIG 5
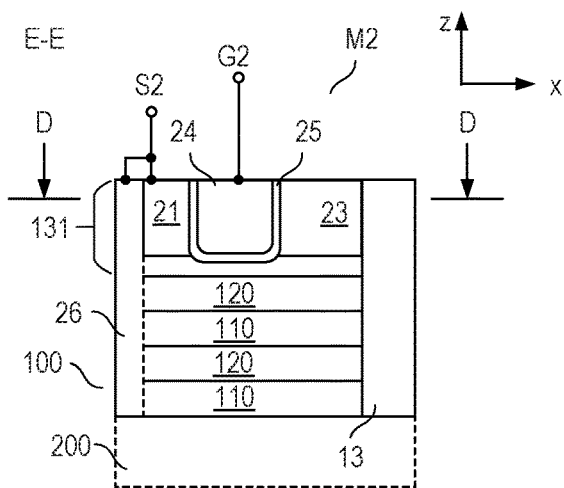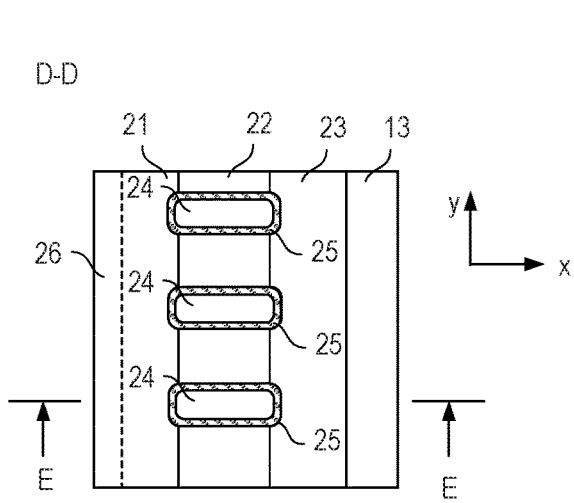
FIG 6A  FIG 6B

SEMICONDUCTOR DEVICE AND METHOD FOR PRODUCING A SEMICONDUCTOR DEVICE

TECHNICAL FIELD

The instant disclosure relates to a semiconductor device and a method for producing a semiconductor device, in particular a semiconductor device with a transistor arrangement.

BACKGROUND

Usually, transistor arrangements include a plurality of transistor devices formed in a semiconductor body. A superjunction transistor device, for example, usually includes at least one drift region of a first doping type (conductivity type) and a compensation region of a second doping type (conductivity type) complementary to the first doping type. The drift region and the compensation region are connected such that in an on-state (switched on state) of the transistor device a current can flow in the drift region, while in the off-state (switched off state) a depletion region expands in the drift region and the compensation region that prevents a current flow through the drift region. A transistor arrangement including a plurality of superjunction transistor devices, therefore, includes a plurality of drift regions and compensation regions. The drift regions and compensation regions of a transistor arrangement may be implemented as a layer stack with a plurality of first semiconductor layers of the first doping type and a plurality of second semiconductor layers of the second doping type.

It is desirable to provide a semiconductor device that requires as few production steps as possible and that may be produced at low costs, and a fast and cost-effective method for producing the same.

SUMMARY

One example relates to a method for producing a semiconductor device. The method includes forming a layer stack with a plurality of first layers of a first doping type and a plurality of second layers of a second doping type complementary to the first doping type on top of a carrier. Forming the layer stack includes forming a plurality of epitaxial layers on the carrier. Forming each of the plurality of epitaxial layers includes depositing a layer of semiconductor material, forming at least two first implantation regions of one of a first type or a second type at different vertical positions of the respective layer of semiconductor material, and forming at least one second implantation region of a type that is complementary to the type of the first implantation regions, wherein the first implantation regions and the second implantation regions are arranged alternatingly Another example relates to a semiconductor device. The semiconductor device includes a layer stack with a plurality of first layers of a first doping type and a plurality of second layers of a second doping type complementary to the first doping type on top of a carrier. The first and second layers are arranged alternatingly within the layer stack. The first and second layers are arranged in a plurality of groups, each of the plurality of groups including at least two layers of one of the first or the second doping type, and at least one further layer of the complementary doping type. A thickness of different first layers within each of the plurality of groups decreases towards the top of the layer stack, and a thickness of different second layers within each of the plurality of groups decreases towards the top of the layer stack.

Examples are explained below with reference to the drawings. The drawings serve to illustrate certain principles, so that only aspects necessary for understanding these principles are illustrated. The drawings are not to scale. In the drawings the same reference characters denote like features.

BRIEF DESCRIPTION OF THE DRAWINGS

FIGS. 1A-1C schematically illustrate a perspective sectional view (FIG. 1A), a vertical cross-sectional view (FIG. 1B), and a horizontal cross-sectional view (FIG. 1C) of a transistor arrangement that includes a first transistor device and a second transistor device integrated in one semiconductor body.

FIGS. 2A-2D show equivalent circuit diagrams that illustrate how the first transistor device and the second transistor device in a transistor arrangement of the type shown in FIGS. 1A-1C may be connected.

FIG. 3A-3B illustrate one example of the second transistor device.

FIGS. 4, 5 and 6A-6B illustrate further examples of the second transistor device.

DETAILED DESCRIPTION

In the following detailed description, reference is made to the accompanying drawings. The drawings form a part of the description and for the purpose of illustration show examples of how the invention may be used and implemented. It is to be understood that the features of the various embodiments described herein may be combined with each other, unless specifically noted otherwise.

Figure 1A:
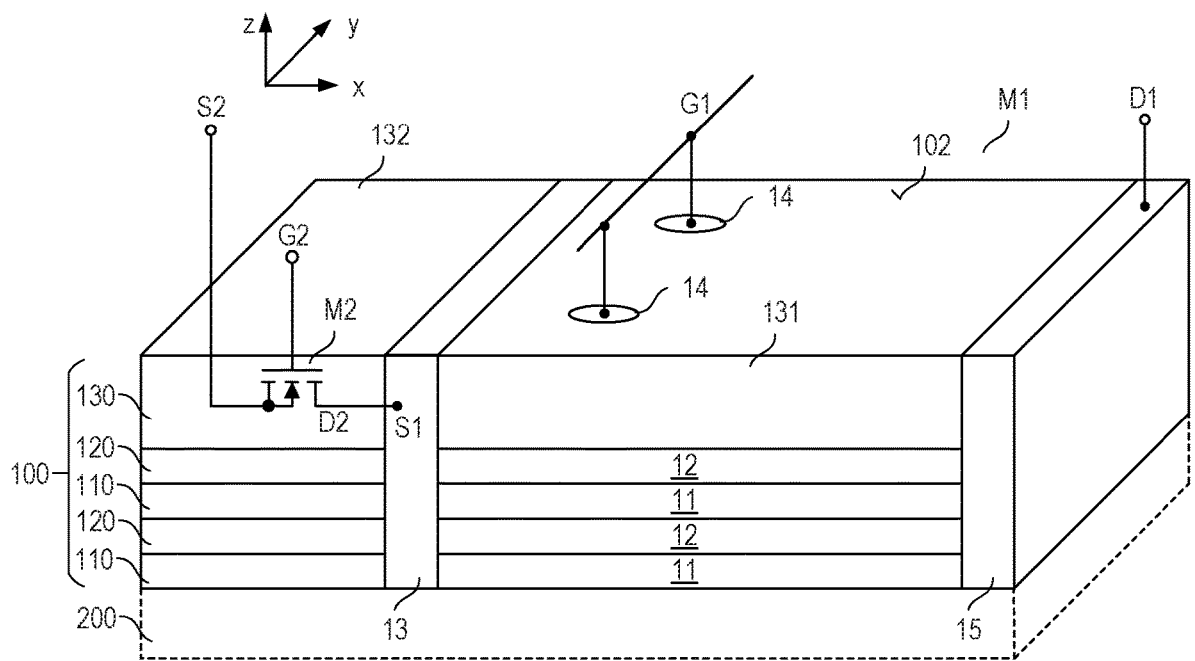
Figure 1B:
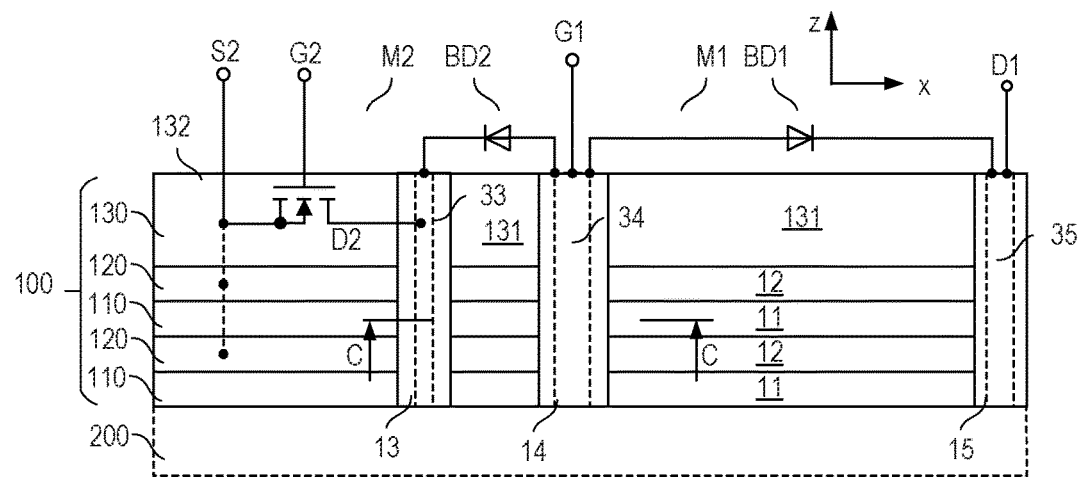

FIGS. 1A to 1C show a perspective sectional view (FIG. 1A), a vertical cross sectional view (FIG. 1B), and a horizontal cross sectional view (FIG. 1C) of a transistor arrangement that includes a first semiconductor component M1 (here: first transistor device) and a second semiconductor component M2 (here: second transistor device). The transistor arrangement includes a layer stack with a plurality of first semiconductor layers 110 of a first doping type and a plurality of second semiconductor layers 120 of a second doping type that are arranged alternatingly. The second doping type is complementary to the first doping type. A source region 13 of the first transistor device M1 adjoins the plurality of first semiconductor layers 110, and a drain region 15 of the first transistor device M1 adjoins the plurality of first semiconductor layers 110 and is located spaced apart from the source region 13 in a first direction x. The source region 13 of the first transistor device M1 is also referred to as first source region 13 in the following, and the drain region 15 of the first transistor device M1 is also referred to as first drain region 15 in the following. The transistor arrangement further includes a plurality of gate regions 14 of the first transistor device M1. Each of the plurality of gate regions 14 adjoins at least one of the plurality of second semiconductor layers 120, is arranged between the first source region 13 and the first drain region 15 and is spaced apart from the first source region 13 and the first drain region 15.

As used herein, a layer or region of the first doping type is a layer or region with an effective doping of the first doping type. Such region or layer of the first doping type, besides dopants of the first doping type, may also include dopants of the second doping type, but the dopants of the first doping type prevail. Equivalently, a layer or region of the second doping type is a layer or region with an effective doping of the second doping type and may contain dopants of the first doping type.

Still referring to FIGS. 1A to 1C, the transistor arrangement further includes a third semiconductor layer 130 that adjoins the layer stack with the first layers 110 and the second layers 120 and each of the first source region 13, the first drain region 15, and the gate regions 14. Active regions of the second transistor device M2 are integrated in the third semiconductor layer 130 in a second region 132. The second region 132 is spaced apart from a first region 131 of the third semiconductor layer 130, wherein the first region 131 is bordered by the first source region 13 and the first drain region 15. At least the first region 131 is a region of the second doping type. The second transistor device M2 is only schematically illustrated in FIGS. 1A and 1B and represented by a circuit symbol.

The third semiconductor layer 130 and the layer stack with the first and second semiconductor layers 110, 120 form an overall layer stack 100, which is also referred to as semiconductor body 100 in the following. The semiconductor body 100 may include a conventional semiconductor material such as, for example, silicon (Si), silicon carbide (SiC), gallium nitride (GaN), gallium arsenide (GaAs), or the like. The semiconductor body 100 may be arranged on any kind of carrier 200 (illustrated in dashed lines in FIGS. 1A and 1B. Examples of this carrier 200 are explained herein further below.

According to one example, the overall number of first layers 110 in the layer stack equals the overall number of second layers 120. In the example shown in FIGS. 1A and 1B, an uppermost layer of the layer stack is a second layer 120 and a lowermost layer is a first layer 110. The "uppermost layer" is the layer adjoining the third layer 130, and the lowermost layer is the layer spaced apart from the uppermost layer most distantly. However, implementing the uppermost layer as a second layer 120 and the lowermost layer as a first layer 110 is only an example. According to another example (not illustrated) the uppermost layer is a first layer 110 and the lowermost layer is a second layer 120. Just for the purpose of illustration, the layer stack with the first and second layers 110, 120 includes two first layers 110 and two second layers 120, that is, four layers overall. This, however, is only an example. According to one example, the overall number of first and second layers 110, 120 in the layer stack is between 4 and 60, in particular between 6 and 30.

The first direction, which is the direction in which the first source region 13 and the first drain region 15 are spaced apart from each other, is a first lateral direction x of the semiconductor body 100 in the example shown in FIGS. 1A to 1C. A "lateral direction" of the semiconductor body 100 is a direction parallel to a first surface 101 of the semiconductor body 100. The first and second layers 110, 120 and the third layer 130 are essentially parallel to the first surface 101 in the example shown in FIGS. 1A to 1C. In this example, each of the first source region 13 and the first drain region 15 extend in a vertical direction z into the semiconductor body 100 so that each of the first source region 13 and the first drain region 15 adjoins the third layer 130 and the first layers 110. The "vertical direction" z is a direction perpendicular to the first surface 101. Further, the gate regions 14 extend in the vertical direction z in the semiconductor body 100 so that each of the plurality of gate regions 14 adjoins each of the second semiconductor layers 120. The gate regions 14 are spaced apart from each other in a second lateral direction y. This second lateral direction y is different from the first lateral direction x and may be perpendicular to the first lateral direction x.

In the example illustrated in FIGS. 1A to 1C, the first transistor device M1 is a lateral superjunction depletion device, more specifically, a lateral superjunction JFET (Junction Field-Effect Transistor). In this transistor device M1, each of the first source region 13 and the first drain region 15 is a region of the first doping type and each of the gate regions 14 is a region of the second doping type. Further, in the section of the semiconductor body 100 between the first source region 13 and the first drain region 15, the first semiconductor layers 110 form drift regions 11 and the second semiconductor layers 120 form compensation regions 12 of the superjunction device. The function of these drift and compensation regions 11, 12 is explained herein further below.

A type of this first transistor device M1 is defined by the first doping type. The first transistor device M1 is an n-type JFET when the first doping type is an n-type and the second doping type is a p-type. Equivalently, the first transistor device M1 is a p-type JFET when the first doping type is a p-type and the second doping type is an n-type.

According to one example, the first source region 13, the first drain region 15, the plurality of gate regions 14, the first and second layers 110, 120 forming the drift and compensation regions 11, 12, and the third layer 130 are monocrystalline semiconductor regions. According to one example, these regions include monocrystalline silicon (Si) and a doping concentration of the first source region 13 is selected from a range of between $1E17$ cm$^{-3}$ ($=1\cdot 10^{17}$ cm$^{-3}$) and $1E21$ cm$^{-3}$, a doping concentration of the drift regions 11 is selected from a range of between $1E13$ cm$^{-3}$ and $5E17$ cm$^{-3}$, and a doping concentration of the gate regions 14 is selected from a range of between $1E17$ cm$^{-3}$ and $1E21$ cm$^{-3}$. The doping concentration of the first drain region 15 can be selected from the same range as the doping concentration of the first source region 13, and the doping concentration of the compensation regions 12 can be selected from the same range as the doping concentration of the drift regions 11.

Referring to FIGS. 1A and 1B, the gate regions 14 of the first transistor device M1 are connected to a first gate node G1 and the first drain region 15 is connected to a first drain node D1. The first gate node G1 and the first drain node D1 are only schematically illustrated in FIGS. 1A and 1B. These nodes G1, D1 may include metallizations (not illustrated) on top of the semiconductor body 100. Optionally, as illustrated in dashed lines in FIG. 1B, a first connection electrode 34 may be embedded in each of the gate regions 14 and a second connection electrode 35 may be embedded in the drain region 35. The first connection electrodes 34 are connected to the gate node G1 and serve to provide a low-ohmic connection between each section of the gate regions 14 and the first gate node G1. The second electrode 35 is connected to the drain node D1 and provides a low-ohmic connection between each section of the drain region 15 and the drain node D1. Further, a third electrode 33 may be embedded in the first source region 13. Referring to FIG. 1B, each of the first, second and third connection electrodes 34, 35, 33 may extend along a complete length of the respective semiconductor region 14, 15, 13 in the vertical direction z. Each of these electrodes 34, 35, 33 includes an electrically conducting material. Examples of such electrically conducting material include, but are not restricted to: a metal such as copper (Cu), aluminum (Al), tantalum (Ta), titanium (Ti), cobalt (Co), nickel (Ni) or tungsten (W); a highly doped polycrystalline semiconductor material such as polysilicon; or a metal silicide, such as tungsten silicide (WSi), titanium silicide (TiSi), cobalt silicide (CoSi), or nickel silicide (NiSi).

The main function of the third semiconductor layer 130 is to accommodate the second transistor device M2. Therefore, the semiconductor layer 130 is designed such that it provides sufficient space to integrate active regions of the second transistor device M2 in the second region 132. According to one example, a thickness of the third semiconductor layer 130 in the second region 132 is between 1 micrometers (µm) and 7 micrometers, in particular between 3 and 5 micrometers. The "thickness" is the dimension of the third layer 130 in the vertical direction z. According to an example, a thickness of the third semiconductor layer 130 is at least twice a thickness of a single first semiconductor layer 110 or a single second semiconductor layer 120. According to one example, a thickness of the third semiconductor layer 130 is at least twice a thickness of each of the first semiconductor layers 110 and the second semiconductor layers 120. The thickness of a single first semiconductor layer 110 or a single second semiconductor layer 120 is, for example, between 100 nanometers (nm) and 3 micrometers (µm). According to another example, a thickness of the third semiconductor layer 130 is greater than a distance between the first source region 13 and each of the gate regions 14.

In or on top of the first region 131 the transistor arrangement may include an edge termination structure (not shown in FIGS. 1A to 1C). This edge termination structure may reduce the thickness of the third layer 130 in the first region 131 as compared to the second region 132.

At least the first region 131 of the third semiconductor layer 130 is a region of the second doping type so that a first p-n junction is formed between the first drain region 15 and the first region 131 and a second p-n junction is formed between the first source region 13 and the first region 131. These p-n junctions are part of two bipolar diodes, a first bipolar diode BD1 formed by the gate regions 14, the first region 131 and the first drain region 15, and a second bipolar diode BD2 formed by the gate regions 14, the first region 131 and the first source region 13. In each of these bipolar diodes BD1, BD2, the first region 131 of the third semiconductor layer 130 forms a base region. Circuit symbols of these bipolar diodes BD1, BD2 are shown in FIG. 1B. According to one example, a doping concentration of the first region 131 of the third semiconductor layer 130 is such that a voltage blocking capability of the first bipolar diode BD1 is equal to or higher than a voltage blocking capability of the first transistor device M1.

The "voltage blocking capability" of the first transistor device M1 is defined by a maximum level of a voltage between the first drain node D1 and the gate node G1 the first transistor device M1 can withstand in an off-state. Dependent on the specific design, the voltage blocking capability may range from 20V up to several 100 volts. This voltage blocking capability may be adjusted, inter alia, by suitably selecting a distance between the first gate region 14 and the first drain region 15. In a first transistor device with a voltage blocking capability of 650 volts, for example, the distance may be selected from between 40 micrometers and 60 micrometers and a doping concentration of the first region 131 may be selected from a range of between 1E13 cm$^{-3}$ and 1E15 cm$^{-3}$, in particular from between 1.1 E14 cm$^{-3}$ and 4.6E14 cm$^3$.

The layer stack with the first and second semiconductor layers 110, 120 adjoins the third layer 130 and, therefore, the second region 132 in which active regions of the second transistor device M2 are integrated. However, the third layer 130 and, in particular, the second region 132 is not obtained based on the first and second layers 110, 120. That is, the second region 132 is not obtained by additionally doping sections of the first and second layers 110, 120 with dopants of the second doping type in order to obtain an effective doping of the second doping type.

Referring to FIGS. 1A and 1B, the first source region 13 is electrically connected to a drain node D2 of the second transistor device M2. The second transistor device M2 further includes a gate node G2 and a source node S2. According to one example, the second transistor device M2 is a normally-off transistor device such as, for example, an enhancement MOSFET. Just for the purpose of illustration, the circuit symbol of the second transistor device M2 shown in FIGS. 1A and 1B represents an n-type enhancement MOSFET. This, however, is only an example. The second transistor device may be implemented as a p-type enhancement MOSFET or a p-type or n-type depletion MOSFET as well.

Optionally, as illustrated in dashed lines in FIG. 1B, those sections of the second semiconductor layers 120 that are arranged below the second region 132 and are separated from those sections that form the compensation regions 12 are connected to the second source node S2. Connections between these second layers 120 and the second source node S2 are schematically illustrated in FIG. 1B.

The first and second transistor device M1, M2 can be interconnected in various ways. According to one example, the source node S2 of the second transistor device M2 is connected to the gate node G1 of the first transistor device M1. An electronic circuit diagram of a transistor arrangement in which the gate node G1 of the first transistor device M1 is connected to the source node S2 of the second transistor device M2 is shown in FIG. 2A. Just for the purpose of illustration and the following explanation it is assumed that the first transistor device M1 is an n-type JFET and the second transistor device M2 is an n-type enhancement MOSFET. The second gate node G2, the second source node S2 and the first drain node D1 are circuit nodes that may serve to connect the transistor arrangement to other devices, a power source, ground or the like in an electronic circuit.

The transistor arrangement may include a housing (package) 300 that is schematically illustrated in FIG. 2A. In this case, the second gate node G2, the second source node S2 and the first drain node D1 are external circuit nodes that are accessible outside the housing 300. According to one example, the gate node G1 of the first transistor device M1 is connected to the source node S2 of the second transistor device M2 inside the housing. A connection between the second source node S2 and the first gate node G1 may be formed by a wiring arrangement (not shown in the figures) that is located on top of the first surface 101 of the semiconductor body 100. According to another example, the first gate node G1 is accessible outside the housing 300 and the first gate node G1 is connected to the second source node S2 by a connection outside the housing 300.

Although the transistor arrangement includes two transistors, first transistor device (JFET) M1 and second transistor device (MOSFET), it can be operated like one single transistor. An operation state of the transistor arrangement is defined by an operation state of the MOSFET M2. The transistor arrangement acts like a voltage-controlled transistor that switches on or off dependent on a drive voltage $V_{GS2}$ received between the second gate node G2 and the second source node S2. This drive voltage is also referred to as gate-source voltage $V_{GS2}$ in the following.

The function of the transistor arrangement shown in FIGS. 1A to 1C and 2A is explained below. Just for the purpose of explanation, it is assumed that the first transistor device M1 is an n-type JFET and the second transistor device M2 is an n-type enhancement MOSFET. Furthermore, for the purpose of explanation, it is assumed that the transistor arrangement operates as an electronic switch connected in series with a load Z, wherein a series circuit with the load Z and the transistor device receives a supply voltage V1.

Referring to FIGS. 2A to 2D, the MOSFET M2 is controlled by the gate-source voltage $V_{GS2}$ received between the second gate node G2 and the second source node S2. The MOSFET M2 is in an on-state (conducting state) when a voltage level of the gate-source voltage $V_{GS2}$ is higher than a predefined threshold voltage level $V_{th1}$. In an n-type enhancement MOSFET, the threshold voltage level $V_{th1}$ is a positive voltage level. The JFET M1 is controlled by a gate-source voltage $V_{GS1}$ received between the first gate node G1 and the first source node S1. An n-type JFET, such as the JFET M1 illustrated in FIGS. 2A to 2D, is in the on-state when a voltage level of the gate-source voltage, such as the gate-source voltage $V_{GS1}$ shown in FIGS. 2A to 2D, is higher than a predefined threshold level $V_{th2}$. That is, the JFET M1 is in the on-state, when $V_{GS1} > V_{th1}$, where $V_{th1} < 0$. As the gate node G1 of the JFET M1 is connected to the source node S2 of the MOSFET M2, the gate-source voltage $V_{GS1}$ of the JFET M1 equals the inverted drain-source voltage $V_{DS2}$ of the MOSFET M2, that is, $V_{GS1} = -V_{DS2}$. The drain-source voltage $V_{DS2}$ of the MOSFET M2 is the voltage between the drain node D2 and the source node S2 of the MOSFET M2.

When the MOSFET M2 is in the on-state, a magnitude of the drain-source voltage $V_{DS2}$ is very low, so that the gate-source voltage $V_{GS1}$ of the JFET is between the negative threshold level $V_{th1}$ and zero. Thus, the JFET M1 is also in the on-state. When the MOSFET M2 switches off, the drain-source voltage $V_{DS2}$ increases until the inverted drain-source voltage $-V_{DS2}$ reaches the negative threshold voltage $V_{th1}$, so that the JFET M1 also switches off.

Referring to FIGS. 1A to 1C, in the on-state of the JFET M1 and the MOSFET M2, a current can flow from the first drain node D1 via the drain region 15, the drift regions 11, the first source region 13, and the drain-source path D2-S2 of the MOSFET M2 to the second source node S2. When the MOSFET M2 switches off, the electrical potential at the first drain node D1 can increase relative to the electrical potential at the second source node S2. This increase of the electrical potential at the first drain node D1 causes an increase of the electrical potential at the first source region 13, while the electrical potential at the gate regions 14 is tied to the electrical potential at the second source node S2. The increase of the electrical potential of the first source region 13 and the drift regions 11 causes p-n junctions between the first source region 13 and the compensation regions 12, and between the gate regions 14 and the drift regions 11 to be reverse biased. Furthermore, p-n junctions between the drift regions 11 and the compensation regions 21 are reverse biased. Reverse biasing those p-n junctions causes the drift regions 11 to be depleted of charge carriers. The JFET M1 switches off as soon as the drift regions 11 between the at least two gate regions 14 and/or between the gate regions 14 and the first source region 13 has been completely depleted of charge carriers.

FIG. 1C shows a horizontal cross-sectional view of the transistor device in a horizontal section plane C-C going through one of drift regions 11. In FIG. 1C, reference character $11_1$ denotes a section of the drift region 11 between two gate regions 14, and $11_2$ denotes a section of the at least one drift region 11 between the gate regions 14 and the first source region 13. The threshold voltage $V_{th1}$ of the JFET M1 is the voltage that needs to be applied between the gate regions 14 and the first source region 13 in order to completely deplete at least one of these sections $11_1$, $11_2$. In FIG. 1C, d1 denotes a distance between two gate regions 14 in the second direction y. The magnitude (the level) of the threshold voltage $V_{th1}$ is dependent on several design parameters and can be adjusted by suitably designing these parameters. These design parameters include the (shortest) distance d1 between two gate regions 14, a doping concentration of the drift region 11 in the section $11_1$ between the gate regions 14, and a doping concentration of the compensations region 21 (out of view in FIG. 1C) in a section that is located between the gate regions 14 and adjoins section $11_1$ of the drift regions 11.

According to one example, the drift regions 11 in the section $11_1$ between the gate electrodes 14 include a higher doping concentration than in sections spaced apart from the gate regions 14 in the direction of the drain region 13. This higher doped section $11_1$ counteracts an increase in the on-resistance caused by the gate regions 14, which reduces the cross section in which a current can flow between the source an drain regions 13 and 15. According to one example, the compensation regions at least in parts of sections arranged between the gate regions 14 include a higher doping concentration than in other sections, in particular, those sections spaced apart from the gate electrodes 14 in the direction of the drain region 15. This higher doped section ensures that the drift regions 11 in the section between the gate regions 14 is depleted of charge carriers, so that the JFET M1 blocks, when the threshold voltage $V_{th1}$ is applied. According to one example, the higher doped region of the at compensation regions 12 is not only arranged between the gate regions 14 but surrounds the gate regions 14 in a horizontal plane, which is a plane parallel to the first surface 101.

The MOSFET M2 may be designed such that a voltage blocking capability of this MOSFET M2 equals or is higher than a magnitude of threshold voltage $V_{th1}$ of the JFET M1, that is $V_{DS2\_MAX} \geq |V_{th1}|$, where $V_{DS2\_MAX}$ is the voltage blocking capability of the MOSFET M2. The voltage blocking capability of the MOSFET M2 is the maximum voltage, the MOSFET M2 can withstand between the drain node D2 and the gate node G1.

In the example shown in FIG. 2A, the transistor arrangement includes three external circuit nodes, the first drain node D1, the second source node S2, and the second gate node G2. According to another example shown in FIG. 2B, in addition to these circuit nodes D1, S2, G2, the first source node S1 is also accessible. According to yet another example shown in FIG. 2C, the second transistor M2 may be deactivated by connecting the second gate node G2 with the second source node S2. In this case, only the first transistor device M1 is active and can be driven by applying a drive voltage $V_{GS1}$ between the first gate node G1 and the first source node S1. According to one example, the first drain node D1, the first gate node G1, the first source node S1, the second gate node G2, and the second source node S2 are external circuit nodes that are accessible outside the housing. In this case, a user/costumer may choose one of the configurations shown in FIGS. 2A to 2C by suitably connecting these circuit nodes D1, G1, S1, G2, and S2. FIG. 2D illustrates another example. In this example, the source nodes S1, S2, the drain nodes D1, D2, and the gate nodes G1, G2 of each of the first and second transistor device M1, M2 are accessible outside of the housing 300.

According to one example, the first and second layers 110, 120 are implemented such that the drift regions 11 and the compensation regions 12 are essentially balanced with regard to their dopant doses. That is, at each position in the current flow direction of the first transistor device, the amount of dopant atoms (dopant charges) in one drift region 11 essentially corresponds to the amount of dopant atoms in the neighboring compensation region 12. "Essentially" means that there may be an imbalance of up to +/−10%. That is, there may be 10% more or less dopant atoms in the drift regions 11 than in the compensation regions 12. Thus, when the first transistor device is in the off-state and depletion regions (space charge regions) expand in the drift and compensation regions 11, 12 essentially each doping atom in each drift region 11 has a corresponding doping atom (which may be referred to as counter doping atom) of a complementary doping in the compensation regions 12 and the drift and compensation regions 11, 12 can be completely depleted. As commonly known, compensation regions in a superjunction transistor device, such as JFET M1 shown in FIGS. 1A to 1C and 2A to 2D, make it possible to implement the drift regions with a higher doping concentration than in a conventional, non-superjunction device. This reduces the on-resistance, which is the electrical resistance in the on-state, without decreasing the voltage blocking capability.

Referring to the above, the second transistor device M2 may be implemented in various ways. Some examples for implementing the second transistor M2 are explained with reference to FIGS. 3A-3B, 4, 5 and 6A-6B below. FIGS. 3A and 3B show a first example of the second transistor device M2, wherein FIG. 3A shows a vertical cross-sectional view and FIG. 3B shows a horizontal cross-sectional view of the second transistor device M2. Referring to FIG. 3A, the second transistor device M2 includes a source region 21 and a drain region 23 spaced apart from the source region 21 in the first lateral direction x. The drain region 23 adjoins the source region 13 of the first transistor device M1 in order to electrically connect the source region 13 of the first transistor device with the drain region 23 of the second transistor device M2. The drain region 23 of the second transistor device M2 is also referred to as second drain region in the following. The source region 21 of the second transistor device M2, which is also referred to as second source region 21 in the following, and the second drain region 23 are separated by a body region 22. The body region 22 has a doping type that is complementary to the doping type of the second source region 21 and the second drain region 23. A doping concentration of the body region 22 is, for example, selected from a range of between 1E16 cm$^{-3}$ and 1E19 cm$^{-3}$, in particular from between 1E17 cm$^{-3}$ and 1E18 cm$^3$.

The second transistor device M2 may be implemented as an enhancement device (normally-off device) or a depletion (normally on-device). In a normally-off device, the body region 22 adjoins the gate dielectric 25 (and the gate electrode 24, in the on-state of the second transistor device M2, generates an inversion channel in the body region 22 along the gate dielectric 25). In a normally-on device, a channel region (not illustrated) of the first doping is arranged between the body region 22 and the gate dielectric 25 and extends from the second source region 21 to the second drain region 23 (and the gate electrode 24, in the off-state of the second transistor device M2, depletes the channel region of charge carriers).

In the example shown in FIGS. 3A and 3B the second drain region 23 adjoins the first source region 13. This, however, is only an example. According to another example (not illustrated), the second drain region 23 and the first source region 13 are connected via a wiring arrangement located on top of the first surface 101 of the semiconductor body 100, Referring to FIG. 3A, a gate electrode 24 is adjacent the body region 22 and dielectrically insulated from the body region 22 by a gate dielectric 25. This gate electrode 24 is electrically connected to the second gate node G2. The second source region 21 is electrically connected to the second source node S2. According to one example, the second transistor device M2 is an n-type transistor device. In this case, the second source region 21 and the second drain region 23 is n-doped, while the body region 22 is p-doped. According to another example, the second transistor device M2 is a p-type transistor device. In this case, the second source region 21 and the second drain region 23 are p-doped semiconductor regions, while the body region 22 is an n-doped semiconductor region. The second transistor device M2 illustrated in FIG. 3A is an enhancement transistor device. In this transistor device, the body region 22 adjoins the gate dielectric 25. According to another example (not illustrated), the second transistor device M2 is a depletion transistor device. In this case, there is a channel region of the same doping type as the second source region 21 and the second drain region 23 arranged between the body region 22 and the gate dielectric 25 and extends from the second source region 21 to the second drain region 23. Referring to FIG. 3B, which shows a horizontal cross-sectional view of the second transistor device M2, the second source region 21, the second drain region 23, and the body region 22 may be elongated in the second lateral direction y of the semiconductor body 100.

Referring to FIG. 3B, a connection region 26 of the second doping type may be connected to the second source node S2 and extend through the second region 132 and the layer stack with the first and second layers 110, 120. This connection region 26 connects those sections of the second layers 120 that are arranged below the second region 132 to the second source region S2. Those sections of the first layers 110 that are arranged below the second region 132 are connected to the first source region 13 and, as the first source region 13 is connected to the second drain region 23, to the second drain region 23. Because of the fact that, below the second region 132, the second layers 120 are connected to the second source node S2 and that the first layers 110 are connected to the second drain node D2 a depletion region can expand in the first and second layer sections 110, 120 below the second region 132 when the second transistor device M2 is in the off-state.

FIG. 4 shows a modification of the transistor device shown in FIGS. 3A and 3B. In this modification, the transistor device M2 includes a drift region 27 (which may also be referred to as drain extension) between the body region 22 and the drain region 23. The drift region 27 has a lower doping concentration than the drain region 23 and the same doping type as the drain region 23. A field electrode 29 is adjacent the drift region 27 and dielectrically insulated from the drift region 27 by a field electrode dielectric 28. According to one example, the field electrode dielectric 28 is thicker than the gate dielectric 25. As illustrated, the field electrode 29 may be electrically connected with the gate electrode 24, for example, by forming the gate electrode 24 and the field electrode as one conductive layer. This is illustrated in FIG. 4. According to another example (not illustrated), the field electrode 29 is electrically connected to the second source node S2 and electrically insulated from the gate electrode 24.

FIG. 5 illustrates another modification of the transistor device illustrated in FIGS. 3A and 3B. In the example illustrated in FIG. 5, the gate electrode 24 and the gate dielectric 25 overlap the drift region 27, but, in the first lateral direction x, do not extend to the drain region 23. An insulation region 41 is arranged between the drift region 27 and those regions of the first surface 101 that are not covered by the gate electrode 24 and the gate dielectric 25. This insulation region 41 may adjoin the drain region 23, as illustrated in FIG. 5. In this example, the drift region 27 adjoins the drain region 23 in a region spaced apart from the first surface 101. The insulation region 41 may include a conventional electrically insulating material such as an oxide. The insulation region 41 may be implemented as a so called STI (Shallow Trench Isolation) and include a thermally grown oxide.

In the example illustrated in FIGS. 3A, 4, and 5, the gate electrode 24 is arranged on top of the first surface 101 of the semiconductor body. This, however, is only an example. According to another example illustrated in FIGS. 6A and 6B, there are several gate electrodes 24 that are arranged in trenches extending from the first surface 101 into the semiconductor body 100. Each of these gate electrodes, in the first lateral direction x, extends from the second source region 21 to the second drain region 23 through the body region 22 and is dielectrically insulated from these semiconductor regions 21, 22, 23 by a gate dielectric 25. Each of these gate electrodes 24 is electrically connected to the second gate node G2, which is schematically illustrated in FIG. 6A.

Second transistor devices of the type illustrated in FIGS. 3A to 3B, 4, 5 and 6A to 6B can be implemented using conventional implantation and oxidation processes known from integrated CMOS (Complementary Metal Oxide Semiconductor) processes. The second transistor device may therefore also be referred to as CMOS device. The second region 132 may have a basic doping of the second doping type or may be intrinsic before forming the active regions (source, body and drain regions 21, 22, 23) of the second transistor device M2 in the second region 132. The basic doping concentration can be selected such that it essentially equals the doping concentration of the body region 22 or is lower than the doping concentration of the body region 22.

In the example illustrated in FIGS. 1A to 1C, the first and second layers 110, 120 in the layer stack are arranged such that they are essentially parallel to the third layer 130 and, therefore, parallel to the first surface 101 of the semiconductor body 100. According to another example (not illustrated), the first and second layers 110, 120 may be arranged such that they are essentially perpendicular to the third layer 130, and, therefore, perpendicular to the first surface 101 of the semiconductor body 100.

Now referring to FIGS. 7A to 7E, a method for forming a layer stack is schematically illustrated. The layer stack may be used for semiconductor devices as have been exemplarily explained with respect to FIGS. 1A to 6B above. Any other kind of semiconductor device, however, may also be at least partly integrated in the layer stack.

Figure 7A:
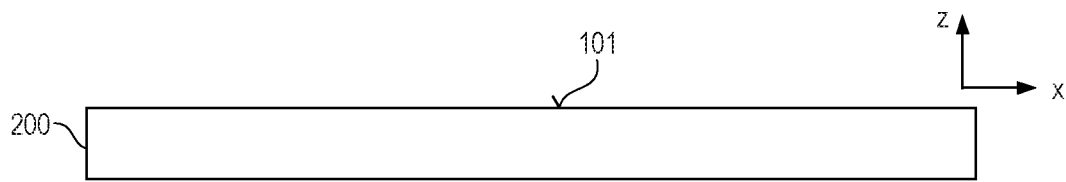
FIGS. 7A-7E illustrate an example of a method for forming a semiconductor device.
Figure 7B:
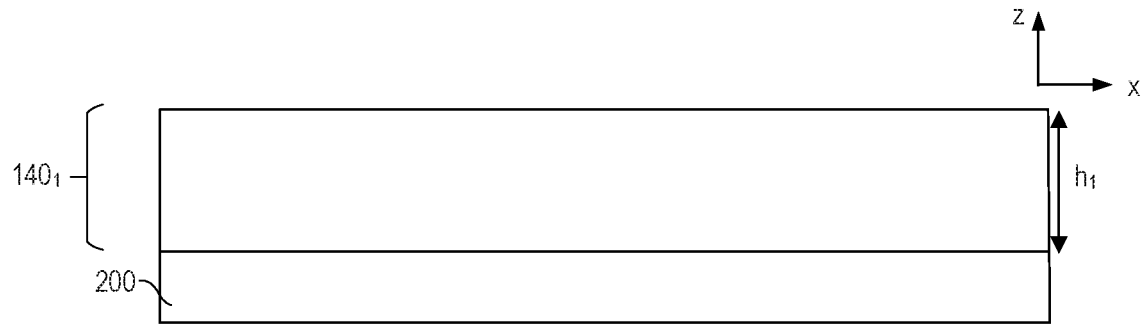
Figure 7C:
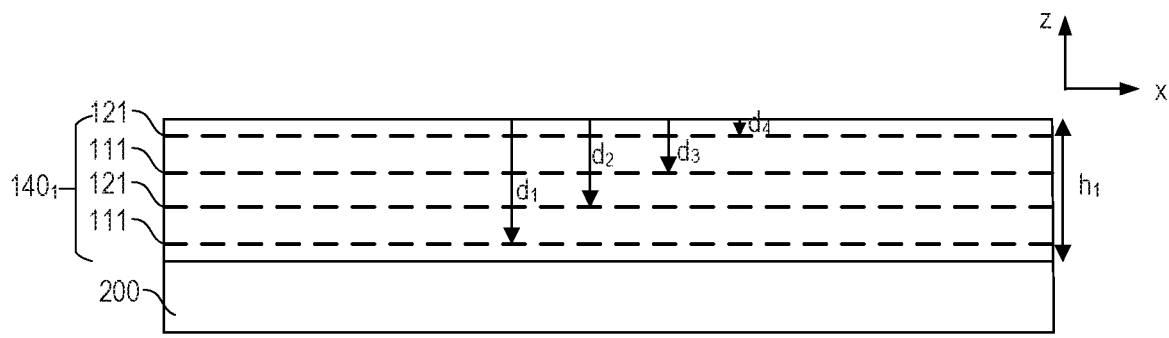

Referring to FIG. 7A, a carrier 200 is illustrated. The carrier 200 may be made of a semiconductor material, for example, such as silicon (Si), silicon carbide (SiC), gallium nitride (GaN), gallium arsenide (GaAs), or the like. Now referring to FIGS. 7B and 7C, a first epitaxial layer $140_1$ is formed on a first surface 101 of the carrier 200. Forming the first epitaxial layer $140_1$ may comprise depositing a layer of semiconductor material on the first surface 101 of the carrier 200 (see FIG. 7B). For example, the layer of semiconductor material may include a conventional semiconductor material such as, for example, silicon (Si), silicon carbide (SiC), gallium nitride (GaN), gallium arsenide (GaAs), or the like. After depositing the layer of semiconductor material, a plurality of implantation regions 111, 121 are formed in the semiconductor material. This is exemplarily illustrated in FIG. 7C. In the example illustrated in FIG. 7C, four implantation regions 111, 121 are formed. This, however, is only an example. According to another example, at least three implantation regions 111, 121 may be formed in the semiconductor material. At least two first implantation regions 111 of either a first type or a second type may be formed at different vertical positions of the layer of semiconductor material. At least one second implantation region 121 may be formed of a type that is complementary to the type of the first implantation regions 111. For example, the first type may be an n-type implantation region and the second type may be a p-type implantation region, or vice versa.

Generally speaking, a first number N of first implantation regions 111, and a second number M of second implantation regions 121 may be formed in the layer of semiconductor material. The first number may either equal the second number (N=M), or the first number may be different from the second number (e.g., N=M±1). As the first and second implantation regions 111, 121 are arranged alternatingly in the epitaxial layer $140_1$, a difference between the first number N and the second number M is generally not more than 1.

Each second implantation region 121 is generally arranged between two first implantation regions 111 and vice versa, with the exception of implantation regions 111, 121 that are arranged adjacent to the horizontal surfaces (top and bottom surfaces) of the first epitaxial layer $140_1$. That is, the first and second implantation regions 111, 121 are arranged alternatingly in the layer of semiconductor material. In the example illustrated in FIG. 7C, one first implantation region 111 is arranged at a first distance $d_1$ from a top surface of the layer of semiconductor material. A top surface of the layer of semiconductor material is a surface facing away from the carrier 200. A second implantation region 121 is arranged at a second distance $d_2$ from the top surface of the layer of semiconductor material. The second distance $d_2$ is less than the first distance $d_1$. Another first implantation region 111 is arranged at a third distance $d_3$ from the top surface of the layer of semiconductor material, wherein the third distance $d_3$ is less than the first distance $d_1$ and the second distance $d_2$. Another second implantation region 121 is arranged at a fourth distance $d4$ from the top surface of the layer of semiconductor material, wherein the fourth distance $d_4$ is less than the first, second and third distances $d_1$, $d_2$, $d_3$.

The distance d, between an implantation region 111, 121 and the top surface generally depends on the implantation energy that is used to form the implantation region 111, 121. For example, the implantation energies for forming the first implantation regions 111 may be chosen from a range of between 200 keV and 5000 keV. A different implantation energy is used for each of the first implantation regions 111 of the same epitaxial layer $140_1$. For example, an implantation energy of 1000 keV may be used to form the lowermost first implantation region 111 at the first distance $d_1$ from the top surface and an implantation energy of 230 keV may be used to form another first implantation region 111 at the third distance $d_3$ from the top surface. The lowermost second implantation region 121, for example, may be formed at the second distance d2 from the top surface using an implantation energy of 1200 keV, and another second implantation region 121 may be formed at the fourth distance $d_4$ by using an implantation energy of 270 keV. This, however, is only an example. The implantation energies given above may apply if the semiconductor body 100 comprises Si as semiconductor material, for example. Any other suitable implantation energies may be used to form the first and second implantation regions 111, 121 at different vertical positions. For example, if other semiconductor materials than Si are used to form the semiconductor body 100, other implantation energies may be suitable. Generally speaking, using higher implantation energies results in implantation regions that are arranged further away from the top surface than implantation regions that are formed with lower implantation energies.

The distance $d_n$ between an implantation region 111, 121 and the top surface, however, may further depend on the material that is used to form the implantation regions 111, 121. For example, implanting boron with an implantation energy of 1000 keV may result in an implantation region that is arranged further away from the top surface than an implantation region that is formed by implanting phosphor at an implantation energy of 1200 keV. Using boron or phosphor for forming the implantation regions 111, 121, however, is only an example. Any other suitable materials may be used. Generally, ions of a first type are used to form the first implantation regions 111, and ions of a second type are used to form the second implantation regions 121.

The implantation dose that is used to form different first implantation regions 111 may be identical. It is, however, also possible to use different implantation doses for forming different first implantation regions 111. The implantation dose that is used to form different second implantation regions 121 may be identical. It is, however, also possible to use different implantation doses for forming different second implantation regions 121. The implantation dose that is used for forming the first implantation regions 111 may be the same or may differ from the implantation dose that is used to form the second implantation regions 121. According to one example, if the semiconductor body 100 comprises Si, a first dose that is used to form the first implantation regions 111 is chosen from a range of between $1.0E12$ $cm^{-2}$ and $4.0E12$ $cm^{-2}$. A second dose that is used to form the second implantation regions 121 may be chosen from a range of between $1.0E12$ $cm^{-2}$ and $4.0E12$ $cm^{-2}$. Other implantation doses may be used, if the semiconductor body 100 comprises another semiconductor material than Si.

Figure 7D:
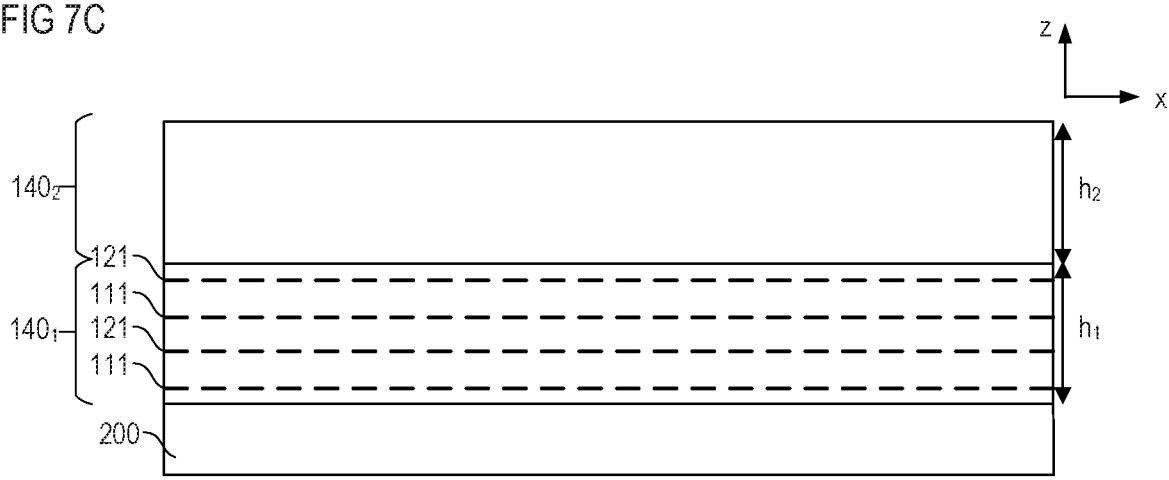
Figure 7E:
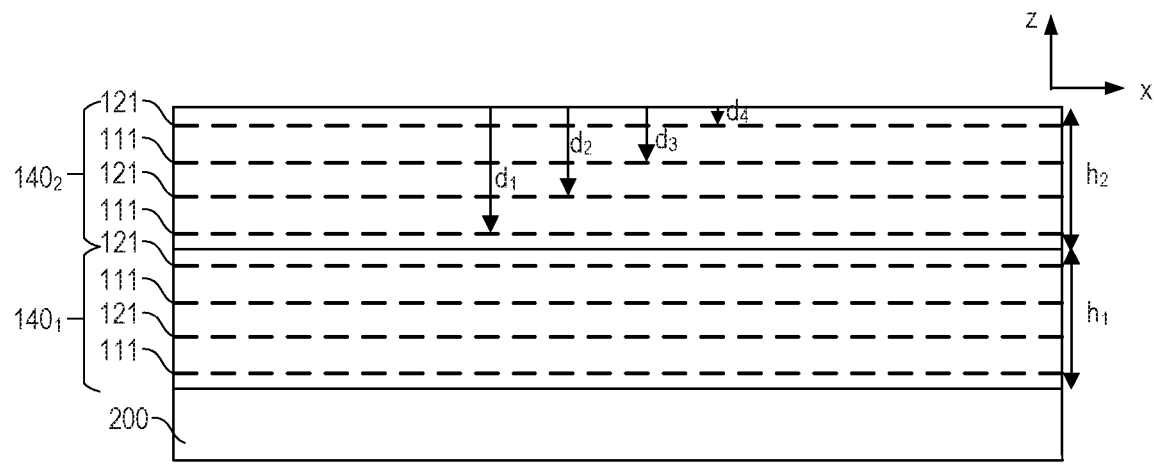

Now referring to FIG. 7D, a second epitaxial layer $140_2$ may be formed on the top surface of the first epitaxial layer $140_1$. A height $h_2$ of the second epitaxial layer $140_2$ may, e.g., equal a height $h_1$ of the first epitaxial layer $140_1$. The second epitaxial layer $140_2$ may be formed of the same material and in the same way as the first epitaxial layer $140_1$. That is, a second layer of semiconductor material is formed on the first epitaxial layer $140_1$. In a further step, first and second implantation regions 111, 121 are formed in the second layer of semiconductor material. This is schematically illustrated in FIG. 7E. The first and second implantation regions 111, 121 in the second epitaxial layer $140_2$ may be formed in the same way as the first and second implantation regions 111, 121 in the first epitaxial layer $140_1$ (see FIG. 7C). In particular, corresponding implantation regions 111, 121 in the first and second epitaxial layers $140_1$, $140_2$ may be formed using the same type of ions, the same implantation dose and the same implantation energy. In this way, after forming the implantation regions 111, 121 in the second epitaxial layer $140_2$, the first and the second epitaxial layers $140_1$, $140_2$ with the implantation regions 111, 121 formed therein are essentially identical.

In the same way, further epitaxial layers $140_k$ may be formed. This, however, is not specifically illustrated in the figures. Any suitable number n of epitaxial layers $140_k$ may be formed on the carrier 200, with $n \geq 2$.

After depositing two or more layers of semiconductor material and forming first and second implantation regions 111, 121 therein, the arrangement may be heated (not specifically illustrated). By heating the first and second implantation regions 111, 121, the implanted ions may be diffused, thereby forming first and second layers 110, 120. Such diffusing processes are generally known and will, therefore, not be described in further detail herein.

Figure 8A:
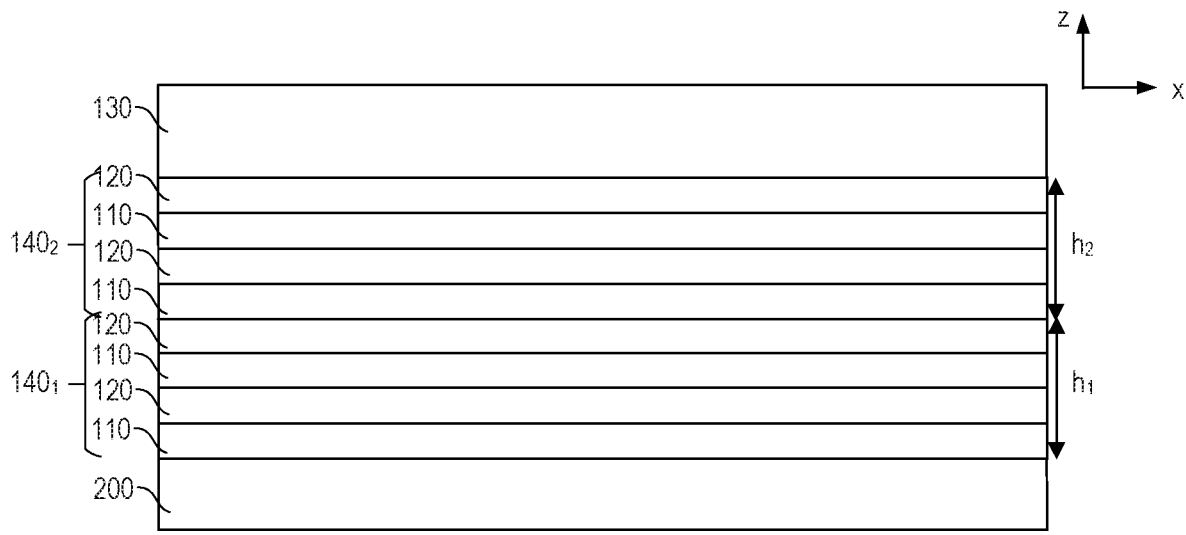
FIGS. 8A-8C schematically illustrate vertical cross-sectional views of a semiconductor device including a layer stack.

Now referring to the example illustrated in FIG. 8A, two epitaxial layers $140_1$, $140_2$ are formed on the carrier 200. In the example illustrated in FIG. 8A, each epitaxial layer $140n$ comprises two first layers 110 and two second layers 120. The first and second layers 110, 120 are arranged alternatingly, forming a layer stack. Being arranged alternatingly, the first and second layers 110, 120 form a plurality of pn-couples (pn-junctions) in the layer stack.

Figure 8B:
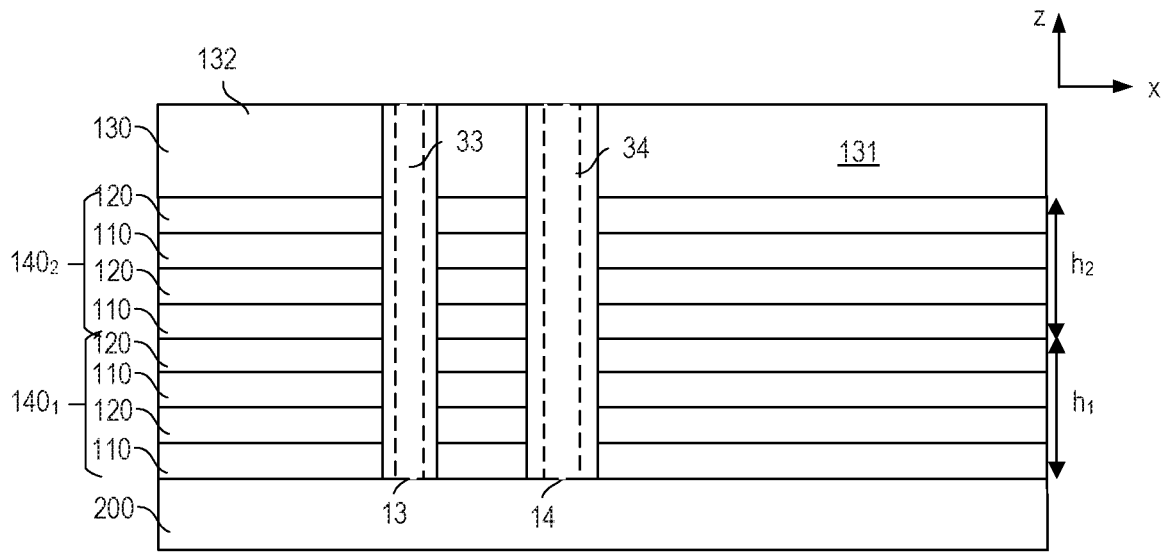

A third layer 130 may be formed on a top surface of the layer stack (top surface of the topmost epitaxial layer $140_k$). A top surface of the layer stack is a surface facing away from the carrier 200. The third layer 130 may comprise monocrystalline semiconductor material. According to one example, the third layer 130 includes monocrystalline silicon (Si). After forming the layer stack and the third layer 130, a first semiconductor component may be formed. The first semiconductor component may be at least partially integrated in the layer stack. Referring to FIG. 8B, forming the first semiconductor component may comprise forming a first semiconductor region 13 in the layer stack adjoining the plurality of first layers 110, and forming at least one second semiconductor region 14 in the layer stack, each of the at least one second semiconductor regions 14 adjoining at least one of the plurality of second layers 120. Each of the at least one second semiconductor region 14 is spaced apart from the first semiconductor region 13 in a horizontal direction x. The first semiconductor component may comprise a diode, for example, the first semiconductor region 13 forming an anode of the diode and the at least one second semiconductor region 14 forming a cathode of the diode, or vice versa. This, however, is only an example.

Figure 8C:
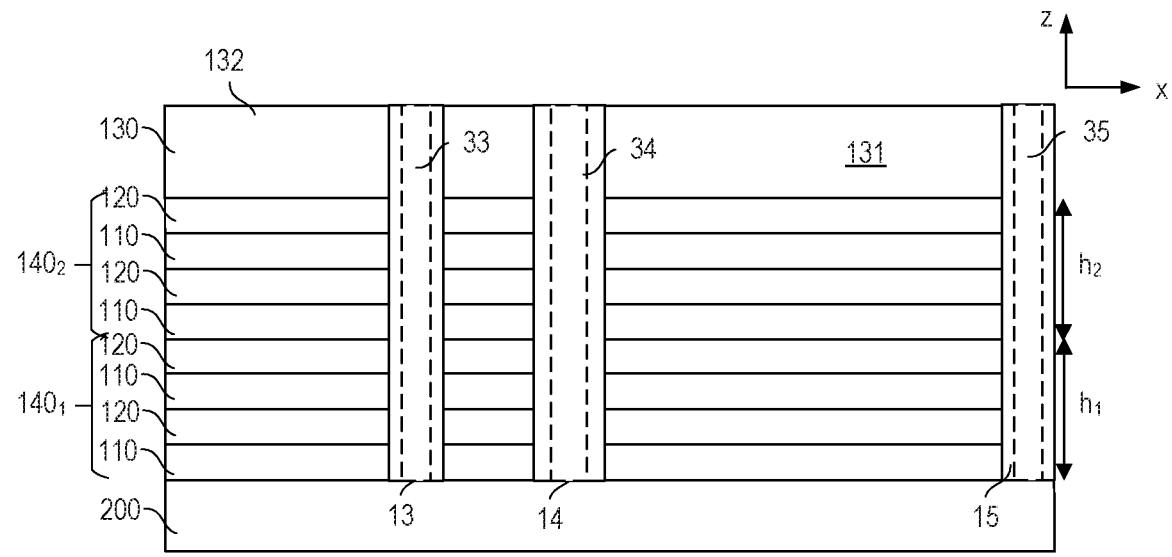

According to another example, the first semiconductor component may comprise a transistor, as has been described with respect to FIGS. 1A to 6B above. In this case, a third semiconductor region 15 may be formed in the layer stack, as is exemplarily illustrated in FIG. 8C. The first, second and third semiconductor regions 13, 14, 15 may correspond to the first source region 13, the first drain region 15, and the plurality of gate regions 14 of the examples illustrated in FIGS. 1A to 6B above. Optionally, first, second and third connection electrodes 34, 35, 33 may be formed extending along a complete length of the respective semiconductor region 14, 15, 13 in the vertical direction z, as has already been described above.

Figure 9:
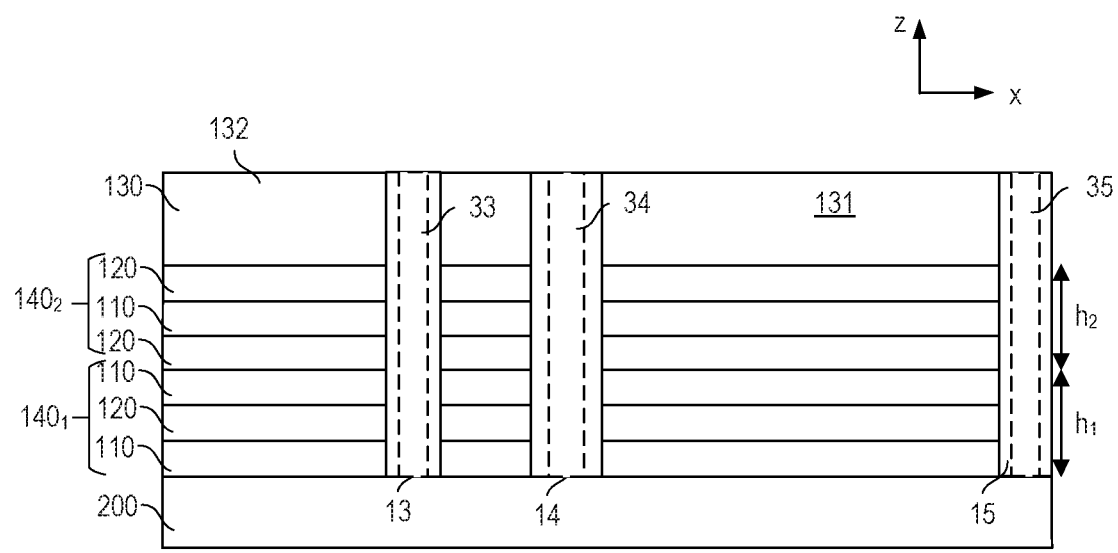
FIG. 9 schematically illustrates a vertical cross-sectional view of another semiconductor device including a layer stack.

In the examples illustrated in FIGS. 7A to 7E and 8A to 8C, each epitaxial layer $140_k$ comprises two first implantation regions 111/first layers 110 and two second implantation regions 121/second layers 120. This, however, is only an example. As is exemplarily illustrated in FIG. 9, it is also possible that one epitaxial layer $140_1$ comprises two first layers 110 and one second layer 120, and another epitaxial layer $140_2$ comprises one first layer 110 and two second layers 120. Each epitaxial layer $140n$ may comprise at least three first and second layers 110, 120 in total. Any other number greater than three is also possible (not illustrated). An epitaxial layer $140_k$ generally may comprise an uneven number of first and second layers 110, 120 (N+M uneven) or an even number of first and second layers 110, 120 (N+M even). According to another example, each epitaxial layer $140n$ comprises three first layers 110 and three second layers 120, or four first layers 110 and four second layers 120, for example.

Figure 10:
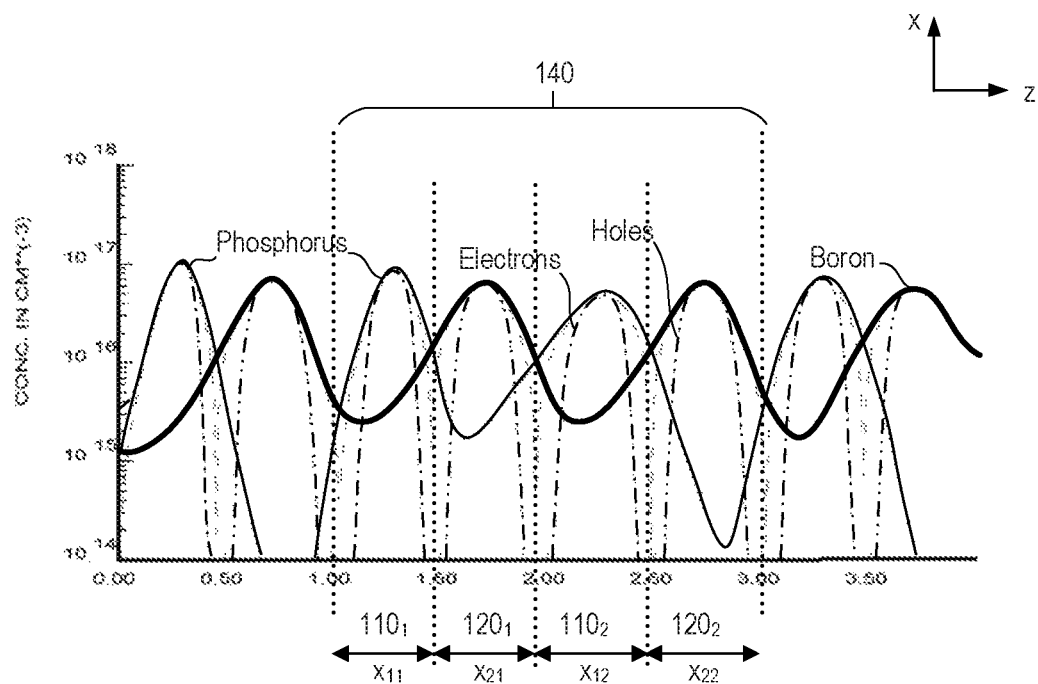
FIG. 10 schematically illustrates an exemplary doping concentration in a semiconductor device.

Now referring to FIG. 10, the distribution of ions in the different first and second layers 110, 120 after diffusion of the ions is exemplarily illustrated. In the example of FIG. 10, the first layers 110 comprise phosphorous, while the second layers 120 comprise boron. The distribution of boron in the exemplary epitaxial layer 140 is illustrated in a bold line. As can be seen, the concentration of the respective ions reaches a maximum in the different layers 110, 120. That is, the concentration of phosphorous reaches a maximum in the first layers 110, and the concentration of boron reaches a maximum in the second layers 120. The concentration of phosphorous, however, is not necessarily zero in the second layers 120 and the concentration of boron is not necessarily zero in the first layers 110. However, the concentration of phosphorous exceeds the concentration of boron in the first layers 110, and the concentration of boron exceeds the concentration of phosphorous in the second layers 120. That is, in the first layers 110, the number of electrons exceeds the number of holes, and in the second layers 120, the number of holes exceeds the number of electrons. Using boron and phosphorous is only an example. Any other suitable ions may be used instead.

Still referring to FIG. 10, the distribution of ions within different first layers $110_1$, $110_2$ of the same epitaxial layer 140 may not be identical. For example, the maximum of the doping concentration of phosphorous in one of the first layers $110_1$ may be greater than the maximum of the doping concentration of phosphorous in another one of the first layers $110_2$. Even further, the distribution of the ions within different first layers $110_1$, $110_2$ may differ. This may result in different thicknesses $x_{1n}$ of different first layers $110_1$, $110_2$. For example, one first layer $110_1$ may have a first thickness $x_{11}$ that is smaller than a second thickness $x_{12}$ of another one of the first layers $110_2$. The thickness of a layer may be determined by the type of implanting ions, the implantation energy and the implantation dose that is used to form the layer. The same applies for the second layers $120_1$, $120_2$ within the same epitaxial layer 140. Further, the distribution of ions within a single layer 110, 120 may be asymmetrical. That is, the maximum of the doping concentration is not necessarily in the center of the respective layer 110, 120 in the vertical direction z.

Different epitaxial layers 140, however, may have an identical structure. That is, a second epitaxial layer $140_2$ that is formed on a first epitaxial layer 140 as illustrated in FIG. 10, may have identical first and second layers $110_1$, $110_2$, $120_1$, $120_2$ with identical maxima of the doping concentrations, identical ion distributions and identical thicknesses x as compared to the epitaxial layer 140 illustrated in FIG. 10.

Figure 11:
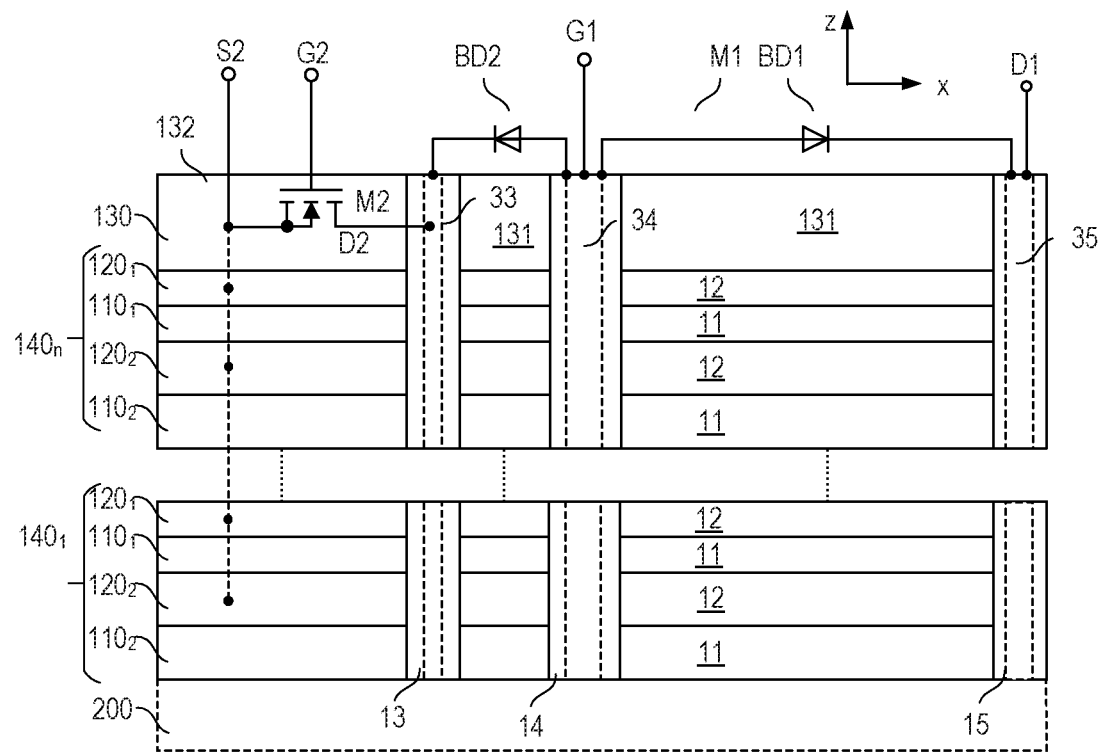
FIG. 11 illustrates a vertical cross-sectional view of a semiconductor device according to one example.

In this way, a repetitive pattern may be formed within the layer stack. This is exemplarily illustrated in FIG. 11. In the example of FIG. 11, two epitaxial layers $140_k$ are exemplarily illustrated. Any other number of epitaxial layers $140_k > 2$, however, is also possible. Each epitaxial layer $140_k$ comprises two first layers $110_1$, $110_2$ and two second layers $120_1$, $120_2$. The lowermost first layer $110_1$ in each of the epitaxial layers $140_k$ has a greater thickness in the vertical direction z than the second one of the first layers $110_2$ that is arranged closer to the third layer 130. The same applies for the second layers $120_1$, $120_2$. That is, the pattern of decreasing thicknesses (towards the top of the layer stack) of the first and second layers 110, 120 is repeated within each epitaxial layer $140_n$.

Figure 12:
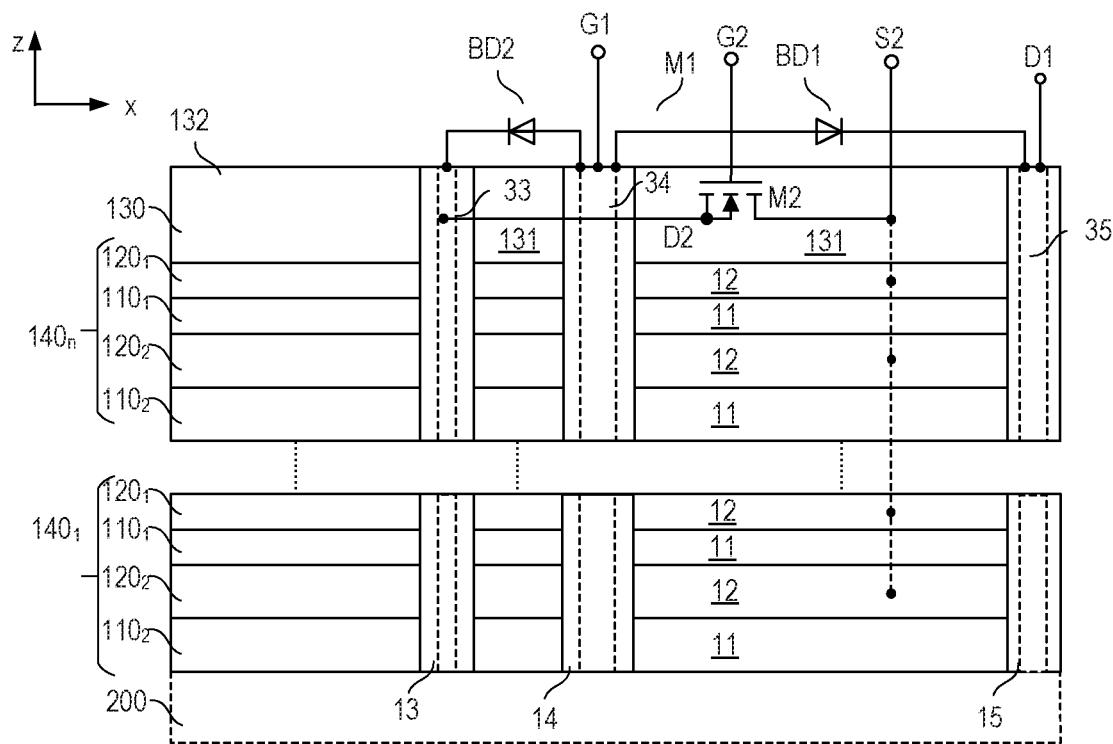
FIG. 12 schematically illustrates a vertical cross-sectional view of a transistor arrangement that includes a first transistor device and a second transistor device integrated in one semiconductor body.

In the example illustrated in FIG. 11, a first and a second semiconductor component M1, M2 are formed similar to the examples illustrated with respect to FIGS. 1A to 1C above. Arranging a first semiconductor component M1 in a first region 131 of the third semiconductor layer 130, and a second semiconductor component M2 in a second region 132 of the third semiconductor layer 130, however, is only an example. As is illustrated in FIG. 12, it is, for example, also possible to arrange both the first semiconductor device M1 and the second semiconductor device in the same region of the third semiconductor layer 130, i.e., in the first region 131 of the third semiconductor layer 130.

Figure 13:
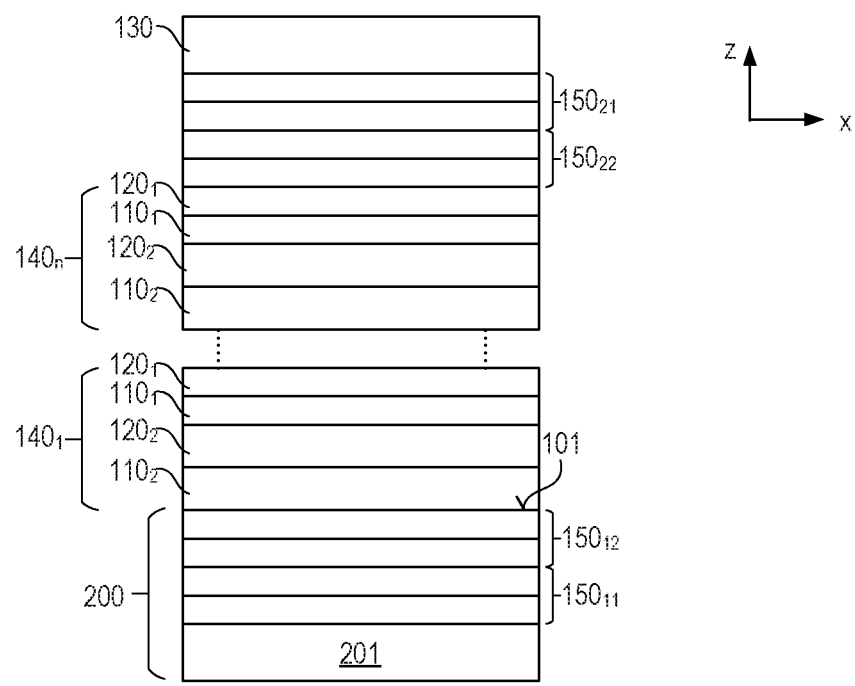
FIG. 13 schematically illustrates a vertical cross-sectional view of a semiconductor device according to another example.

In the examples illustrated in FIGS. 7A to 9 above, the layer stack is arranged directly adjacent to the third semiconductor layer 130. This, however, is only an example. As is schematically illustrated in FIG. 13, additional layers may be arranged between the third semiconductor layer 130 and the layer stack. The additional layers may form at least a first pn-couple (pn-junction) $150_{21}$ and a second pn-couple $150_{22}$. Such additional pn-couples $150_{21}$, $150_{22}$ may form an upper edge of the layer stack.

In the examples of FIGS. 7A to 9, the carrier 200 includes a single layer. This, however, is only an example. According to another example, as is illustrated in FIG. 12, the carrier 200 may comprise a plurality of layers. The plurality of layers may form at least a third and a fourth pn-couples (pn-junction) $150_{11}$, $150_{12}$. The third and fourth pn-couples $150_{11}$, $150_{12}$ may form a lower edge of the layer stack. The additional pn-couples 150, however, are not part of the layer stack and are not a part of the repetitive pattern of first and second layers 110, 120.

The additional layers forming the additional pn-couples (150) may be formed using a different implantation dose as compared to the first and second layers 110, 120 forming the layer stack.

Referring to the examples illustrated herein before, the first layers 110 having the first doping type may adjoin the second layers 120 having the second doping type. Towards any interface between a first layer 110 and a second layer 120, the doping concentration in the first layer 110 decreases towards an intrinsic level, and in the second layer 120, the doping concentration decreases towards the intrinsic level. Thus, inevitably, there is a (narrow) region with an intrinsic doping level between each of the first layers 110 and an adjacent second layer 120. According to another example (not illustrated), there may be an intrinsic layer between each of the first layers 110 and the adjacent second layer 120. "Intrinsic" in this context means that the doping concentration is either lower than $1E11\ cm^{-3}$ or lower than 1% or even lower than 0.5% of a maximum doping concentration of each of the first and second layers 110, 120. A width of these intrinsic layers may be wider than necessary to simply separate the first layers 110 from the second layers 120. According to one example, a width of each of these intrinsic layers is between 50% and 150% of a width of a first and second layer 110, 120. The "width" of each of the first and second layers 110, 120 in this example may be defined by a shortest distance between the two intrinsic layers bordering the respective first or second layer 110, 120.

As has been described above, the semiconductor body 100 with the first and second semiconductor layers 110, 120 and the third semiconductor layer 130 may be arranged on a carrier 200. This carrier 200 may be implemented in various ways. Some examples of how the carrier 200 may be implemented are explained in the following.

Figure 14:
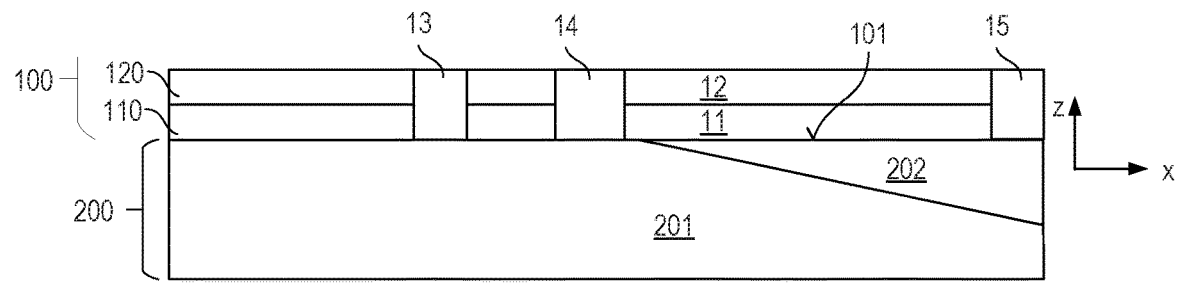
FIGS. 14-17 show different examples of a carrier of the semiconductor device.

FIG. 14 illustrates a first example of the carrier 200. In this example, the carrier 200 is made of a semiconductor material. According to one example, the semiconductor material of the carrier 200 is the same semiconductor material as the semiconductor material of the semiconductor body 100 arranged on top of the carrier 200.

In the example illustrated in FIG. 14, the first drain region 15 and the first source region 13, in the semiconductor body 100, extend down to the carrier 200. In order to avoid a short-circuit between the first drain region 15 and the first source region 13 in the carrier 200, the carrier 200 includes a p-n junction between the first drain region 15 and the first source region 13. This p-n junction is formed between a first carrier region 201 of the second doping type and a second carrier region 202 of the first doping type. The first carrier region 201 adjoins the first source region 13, and the second carrier region 202 adjoins the first drain region 15. Referring to FIG. 14, the second carrier region 202, in the first lateral direction x, may extend along an interface between the carrier 200 and the semiconductor body 100 to the gate regions 14 (from which only one is shown in FIG. 14) or beyond the gate regions 14. This, however, is only an example. According to another example (illustrated in FIG. 14) the second carrier region 202 may end spaced apart from the gate regions 14. According to one example, the second carrier region 202 is implemented such that a dimension of the second carrier region 202 in the vertical direction z decreases as a distance from the first drain region 15 increases. In the example illustrated in FIG. 14, the vertical dimension of the second carrier region 202 linearly decreases as the distance from the first drain region 15 increases. This, however, is only an example. According to another example, the vertical dimension of the second carrier region 202 decreases non-linearly as the distance from the drain region 15 increases.

Figure 15:
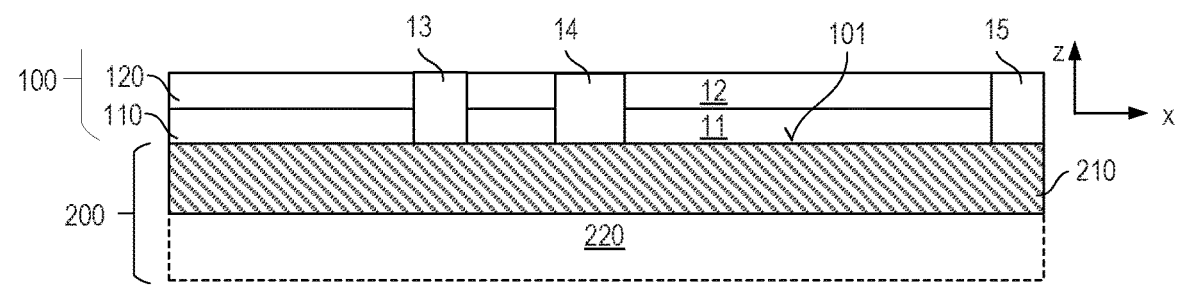

FIG. 15 illustrates a carrier 200 according to another example. In this example, the carrier 200 includes an insulation layer 210 that adjoins the semiconductor body 100 and an optional semiconductor substrate 220 (illustrated in dashed lines) on which the insulation layer 210 is arranged. The substrate 220 can be omitted so that the carrier 200 may only consist of the insulation layer 210. As in the example illustrated in FIG. 14, each of the first source regions 13, the first drain region 15 and the gate regions 14 extends down to the carrier 200 in the semiconductor body 100. In the example shown in FIG. 15, the insulation layer 210 provides for an insulation between the first source regions 13 and the first drain region 15 in the carrier 200.

Figure 16:
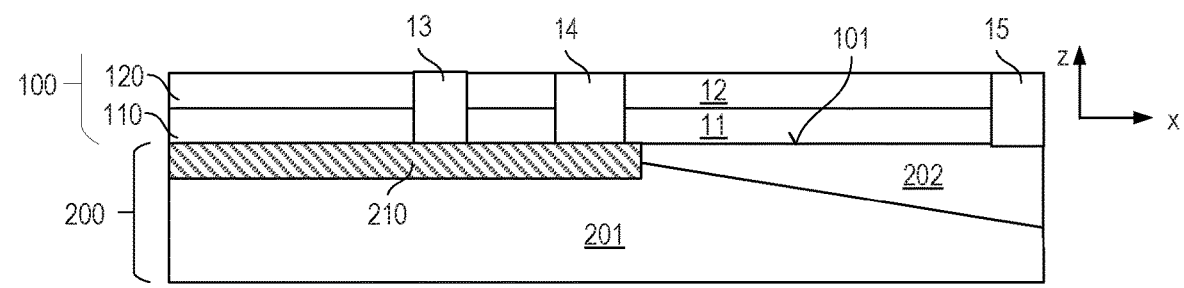

FIG. 16 illustrates another example of the carrier 200. The carrier 200 illustrated in FIG. 16 includes features from both the example illustrated in FIG. 14 and the example illustrated in FIG. 15. More specifically, the carrier 200 includes the first carrier region 201 and the second carrier region 202 explained with reference to FIG. 14. Additionally, the insulation layer 210 is arranged between the first carrier region 201 and the semiconductor body 100.

Figure 17:
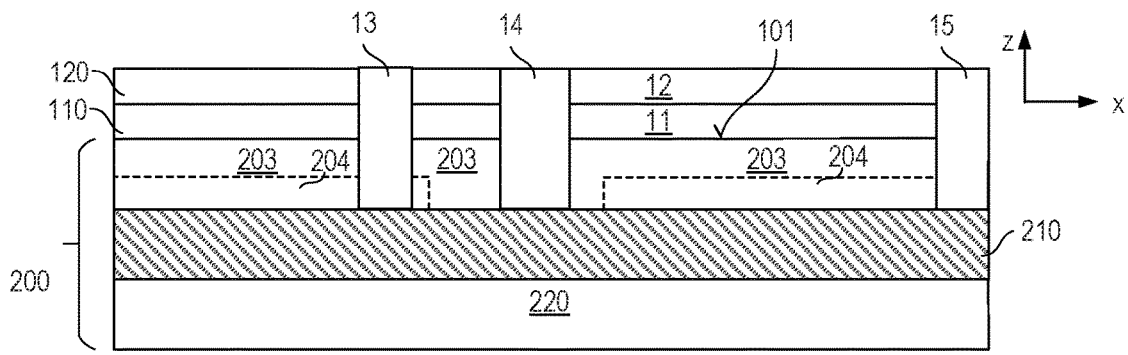

FIG. 17 illustrates a modification of the carrier 200 illustrated in FIG. 15. In the example illustrated in FIG. 17, a semiconductor layer 203 of the second doping type is arranged between the insulation layer 210 and the layer stack with the first and second semiconductor regions 110, 120. The first source regions 13, the gate regions 14, and the first drain region 15 may extend through this layer 203 of the carrier 200 down to the insulation layer 210. Optionally, semiconductor regions 204 are arranged in the layer 203. These semiconductor regions 204 have the first doping type and may adjoin the insulation layer 210. Each of these regions 204 is connected to at least one of the first source regions 13 and the first drain region 15.

Figure 18:
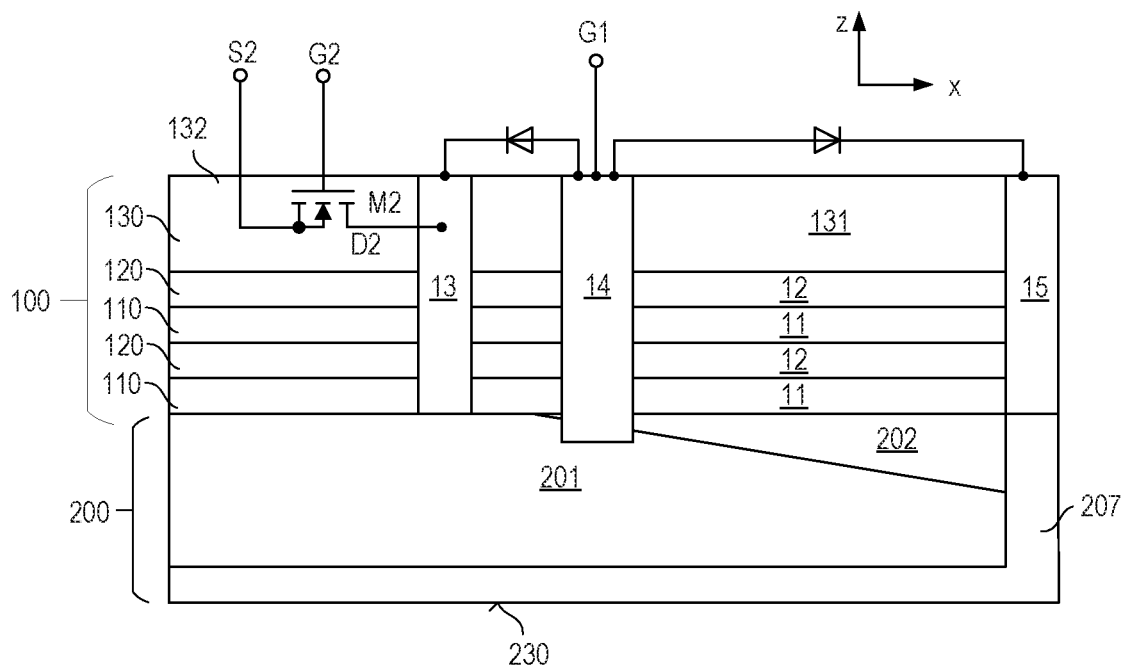
FIG. 18 shows a vertical cross-sectional view of a transistor arrangement with a drain down first transistor device.

Referring to FIG. 18, the first transistor device M1 may be implemented as a drain-down transistor. In this case, the carrier 200 includes a drain region extension region 207 at a first surface 230 of the carrier 200. The first surface 230 of the carrier 201 faces away from the first surface 101 of the semiconductor body 100. The drain extension region 207 further includes a connection region of the first doping type that connects the drain extension region 207 to the first drain region 15. In the example illustrated in FIG. 18, the carrier 200 further includes a first carrier region 201, and a second carrier region 202 as explained herein before. This, however, is only an example. Other topologies of the carrier may be used as well.

Figure 19:
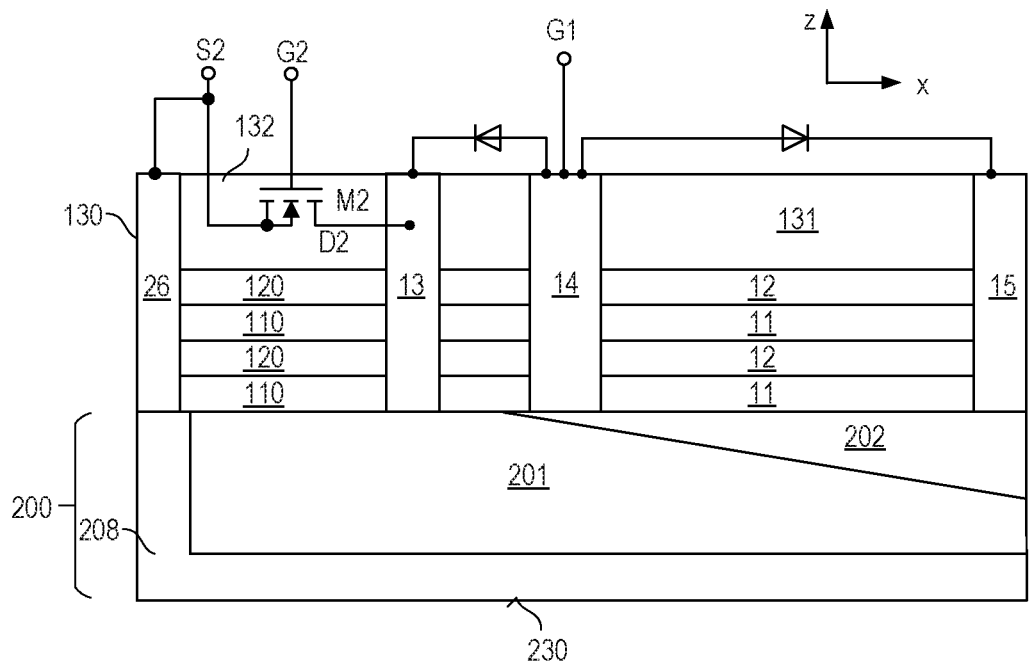
FIG. 19 shows a vertical cross-sectional view of a transistor arrangement with a source down first transistor device.

FIG. 19 illustrates a modification of the transistor arrangement illustrated in FIG. 18. In this example, the second source region 21 can be contacted via the first surface 201 of the carrier 200. In this example, the carrier 200 includes a source extension region 208 along the first surface 230 of the carrier 200. Further, the source extension region 208 adjoins a contact region 26 of the first doping type. This contact region 26 extends through the layer stack with the first and second semiconductor layers 110, 120 down to the carrier 200. Further, this contact region 26 is connected to the source region of the second transistor device M2. This second transistor device M2 is only schematically illustrated in FIG. 19. How the contact region 26 may be connected to the second source region 21 is illustrated in FIGS. 3A to 3B, 4, 5, and 6A to 6B in which the contact region 26 is illustrated in dashed lines.

Referring to the above, the second transistor M2 is formed in the second region 132 or in the first region in order to obtain a second transistor M2 of any of the types explained herein before. Any other suitable implementations of the second transistor M2 are also possible. Forming the second transistor M2 may include conventional processes for forming transistor devices in a CMOS technology.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method, comprising:
   forming a layer stack with a plurality of first layers of a first doping type and a plurality of second layers of a second doping type complementary to the first doping type on top of a carrier,
   wherein forming the layer stack comprises forming a plurality of epitaxial layers on the carrier,
   wherein forming each of the plurality of epitaxial layers comprises depositing a layer of semiconductor material, forming at least two first implantation regions of one of a first type or a second type at different vertical positions of the respective layer of semiconductor material, and forming at least one second implantation region of a type that is complementary to the type of the first implantation regions,
   wherein the first implantation regions and the second implantation regions are arranged alternatingly,
   wherein forming each implantation region of the first type comprises implanting ions of a first type, and wherein forming each implantation region of the second type comprises implanting ions of a second type,
   wherein the first layers and the second layers are arranged in a plurality of groups, each of the groups comprising a first one of the second layers being disposed above a first one of the first layers and below a second one of the first layers,
   wherein the first one of the second layers and the first and second ones of the first layers are formed by heating the epitaxial layers with the implantation regions formed therein to diffuse the implanted ions from the at least two first implantation regions and the at least one second implantation region,
   wherein for each of the groups the first one of the second layers forms a first p-n junction with the first one of the first layers and forms a second p-n junction with the second one of the first layers.

2. The method of claim 1, wherein each of the plurality of epitaxial layers comprises a first number of first implantation regions and a second number of second implantation regions, wherein the first number is different from the second number or the first number equals the second number.

3. The method of claim 1, wherein the ions of the first type are implanted with a first dose and the ions of the second type are implanted with a second dose.

4. The method of claim 3, wherein the first dose is in a range of $1.0E12$ $cm^{-2}$ and $4.0E12$ $cm^{-2}$ and/or the second dose is in a range of $1.0E12$ $cm^{-2}$ and $4.0E12$ $cm^{-2}$.

5. The method of claim 1, wherein different first semiconductor layers within the same epitaxial layer have different thicknesses which decrease towards a top of the layer stack, and wherein different second semiconductor layers within the same epitaxial layer have different thicknesses which decrease towards the top of the layer stack.

6. The method of claim 5, wherein corresponding first and second layers of different epitaxial layers have corresponding thicknesses such that two or more consecutive epitaxial layers within the layer stack form a recurring pattern of first and second layers.

7. The method of claim 1, wherein the first layers comprise boron and/or the second layers comprise phosphorus.

8. The method of claim 1, wherein each of the plurality of epitaxial layers has a thickness in a vertical direction of between 3 µm and 8 µm.

9. The method of claim 1, further comprising forming a first semiconductor component in the layer stack, wherein forming the first semiconductor component comprises:
   forming a first semiconductor region adjoining the plurality of first semiconductor layers; and
   forming at least one second semiconductor region,
   wherein each of the at least one second semiconductor regions region adjoins at least one of the plurality of second semiconductor layers and is spaced apart from the first semiconductor region.

10. The method of claim 9, further comprising forming a third semiconductor region adjoining the plurality of second semiconductor layers and spaced apart from the first semiconductor region and the at least one second semiconductor region in a first direction, wherein each of the at least one second semiconductor region is arranged between the first semiconductor region and the third semiconductor region.

11. The method of claim 1, further comprising:
    forming a third layer on top of the layer stack; and
    forming a transistor device at least partly integrated in the third layer.

12. The method of claim 1, wherein forming each of the plurality of epitaxial layers comprises forming at least two of the second implantation regions in each of the epitaxial layers.

13. The method of claim 12, wherein different implantation energies are used for forming different first implantation regions within a single epitaxial layer, and wherein different implantation energies are used for forming different second implantation regions within a single epitaxial layer.

14. The method of claim 11, wherein the transistor device is configured as a lateral device.

15. A semiconductor device, comprising:
    a layer stack with a plurality of first layers of a first doping type and a plurality of second layers of a second doping type complementary to the first doping type on top of a carrier,
    wherein the first layers and the second layers are arranged alternatingly within the layer stack,
    wherein the first layers and the second layers are arranged in a plurality of groups, each of the plurality of groups comprising a first one of the second layers being disposed above a first one of the first layers and below a second one of the first layers,
    wherein for each of the groups the first one of the second layers forms a first p-n junction with the first one of the first layers and forms a second p-n junction with the second one of the first layers, and
    wherein for each of the groups the first one of the first layers has a greater thickness than the second one of the first layers.

16. The semiconductor device of claim 15, further comprising:
    a third layer on top of the layer stack; and
    a transistor device at least partly integrated in the third layer,
    wherein the transistor device is configured as a lateral device.

17. The semiconductor device of claim 15, wherein each of the plurality of groups comprises a second one of the second layers being disposed above the second one of the first layers, and wherein for each of the groups the first one of the second layers has a greater thickness than the second one of the second layers.

\* \* \* \* \*

UNITED STATES PATENT AND TRADEMARK OFFICE
CERTIFICATE OF CORRECTION

PATENT NO. : 11,404,535 B2
APPLICATION NO. : 16/704328
DATED : August 2, 2022
INVENTOR(S) : R. Weis et al.

It is certified that error appears in the above-identified patent and that said Letters Patent is hereby corrected as shown below:

In the Claims

Column 20, Line 17 (Claim 9) please change "regions region adjoins" to -- region adjoins --

Signed and Sealed this
Eighteenth Day of October, 2022

Katherine Kelly Vidal
*Director of the United States Patent and Trademark Office*